US012785640B2

(12) United States Patent
Wloczysiak

(10) Patent No.: US 12,785,640 B2
(45) Date of Patent: Nov. 3, 2026

(54) FRONT-END RECEIVER WITH MULTI-STAGE, TIERED BANDWIDTH AMPLIFIERS

(71) Applicant: Skyworks Solutions, Inc., Irvine, CA (US)

(72) Inventor: Stephane Richard Marie Wloczysiak, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 415 days.

(21) Appl. No.: 18/476,148

(22) Filed: Sep. 27, 2023

(65) Prior Publication Data

US 2024/0106402 A1 Mar. 28, 2024

Related U.S. Application Data

(60) Provisional application No. 63/410,981, filed on Sep. 28, 2022, provisional application No. 63/410,975, (Continued)

(51) Int. Cl.
*H04B 1/00* (2006.01)
*H03F 1/56* (2006.01)
*H03F 3/72* (2006.01)

(52) U.S. Cl.
CPC ............... *H03F 3/72* (2013.01); *H03F 1/565* (2013.01); *H04B 1/006* (2013.01); (Continued)

(58) Field of Classification Search
CPC ...... H03F 3/72; H03F 1/565; H03F 2200/294; H03F 2200/451; H03F 2203/7209; H03F 3/195; H03F 2200/111; H04B 1/006
See application file for complete search history.

(56) References Cited

U.S. PATENT DOCUMENTS 8,325,632 B2 * 12/2012 Gorbachov .......... H04B 7/0817 343/835
8,331,887 B2 12/2012 Tuttle et al.
(Continued)

FOREIGN PATENT DOCUMENTS

JP 2004-289428 10/2004
KR 10-1896262 9/2018

OTHER PUBLICATIONS

International Search Report and Written Opinion of PCT Application No. PCT/US2023/075168, dated Jan. 30, 2024, in 17 pages.
(Continued)

*Primary Examiner* — Ping Y Hsieh
(74) *Attorney, Agent, or Firm* — VIA LLP

(57) ABSTRACT

Disclosed is a diversity receive radio frequency front-end architecture with support for carrier aggregation and multiple-input/multiple-output. The front-end architecture can include multi-stage low noise amplifiers. Outputs from multiple initial low noise amplifier stages can be switched into each secondary low noise amplifier stage, thereby reducing the amount of componentry. The secondary low noise amplifier stages can be dynamically tuned depending on a currently active band and can be relatively broadband compared to the initial low noise amplifier stages.

20 Claims, 12 Drawing Sheets

Related U.S. Application Data filed on Sep. 28, 2022, provisional application No. 63/411,002, filed on Sep. 28, 2022.

(52) U.S. Cl.
CPC .. *H03F 2200/294* (2013.01); *H03F 2200/451* (2013.01); *H03F 2203/7209* (2013.01)

(56) References Cited

U.S. PATENT DOCUMENTS

| | | | |
|---|---|---|---|
| 8,374,557 | B2 | 2/2013 | Gorbachov |
| 9,118,533 | B2 | 8/2015 | Elenes et al. |
| 9,485,001 | B2 | 11/2016 | Wloczysiak et al. |
| 9,553,619 | B2 | 1/2017 | Domino |
| 9,571,037 | B2 | 2/2017 | Wloczysiak |
| 9,602,156 | B2 | 3/2017 | Wloczysiak |
| 9,621,327 | B2 | 4/2017 | Chang et al. |
| 9,667,324 | B2 | 5/2017 | Wloczysiak |
| 9,825,660 | B2 | 11/2017 | Wloczysiak et al. |
| 9,893,752 | B2 | 2/2018 | Domino et al. |
| 9,893,794 | B2 | 2/2018 | Wloczysiak |
| 9,960,793 | B2 | 5/2018 | Anthony et al. |
| 9,985,680 | B2 | 5/2018 | Wloczysiak |
| 10,050,653 | B2 | 8/2018 | Pehlivanoglu |
| 10,050,694 | B2 | 8/2018 | Wloczysiak |
| 10,056,925 | B2 | 8/2018 | Domino |
| 10,069,615 | B2 | 9/2018 | Chang et al. |
| 10,075,199 | B2 | 9/2018 | King et al. |
| 10,122,422 | B2 | 11/2018 | Wloczysiak |
| 10,135,469 | B2 | 11/2018 | Chang et al. |
| 10,182,403 | B2 | 1/2019 | Ripley |
| 10,205,490 | B2 | 2/2019 | Wloczysiak |
| 10,211,857 | B2 | 2/2019 | King et al. |
| 10,218,390 | B2 | 2/2019 | Wloczysiak et al. |
| 10,218,427 | B2 | 2/2019 | Wloczysiak et al. |
| 10,230,432 | B2 | 3/2019 | Wloczysiak |
| 10,432,235 | B2 | 10/2019 | Thompson et al. |
| 10,439,665 | B2 | 10/2019 | Domino et al. |
| 10,447,317 | B2 | 10/2019 | Chang et al. |
| 10,447,442 | B2 | 10/2019 | Pehlke et al. |
| 10,447,458 | B2 | 10/2019 | Chang et al. |
| 10,454,506 | B2 | 10/2019 | King et al. |
| 10,477,550 | B2 | 11/2019 | Balteanu |
| 10,581,466 | B2 | 3/2020 | Pehlke |
| 10,587,291 | B2 | 3/2020 | Pehlke et al. |
| 10,623,337 | B2 | 4/2020 | Wloczysiak et al. |
| 10,630,320 | B2 | 4/2020 | King |
| 10,727,893 | B2 | 7/2020 | Zhang et al. |
| 10,826,546 | B2 | 11/2020 | Pehlivanoglu |
| 10,855,319 | B2 | 12/2020 | Anthony et al. |
| 10,873,384 | B2 | 12/2020 | Wloczysiak et al. |
| 10,944,523 | B2 | 3/2021 | Pehlke et al. |
| 10,979,088 | B2 | 4/2021 | Chang et al. |
| 10,985,784 | B2 | 4/2021 | King |
| 11,018,727 | B2 | 5/2021 | Wloczysiak |
| 11,038,543 | B2 | 6/2021 | Chang et al. |
| 11,064,491 | B2 | 7/2021 | Balteanu |
| 11,070,347 | B2 | 7/2021 | Chang et al. |
| 11,152,960 | B2 | 10/2021 | Thompson et al. |
| 11,190,223 | B2 | 11/2021 | Wloczysiak et al. |
| 11,271,602 | B2 | 3/2022 | Domino et al. |
| 11,296,734 | B2 | 4/2022 | Anthony et al. |
| 11,445,445 | B2 | 9/2022 | Ripley |
| 11,646,782 | B2 | 5/2023 | Wloczysiak et al. |
| 11,664,829 | B2 | 5/2023 | Jayaraman et al. |
| 11,664,839 | B2 | 5/2023 | Pehlivanoglu |
| 11,664,963 | B2 | 5/2023 | Chang et al. |
| 11,671,125 | B2 | 6/2023 | Anthony et al. |
| 2004/0014435 | A1 | 1/2004 | Woo et al. |
| 2010/0226292 | A1* | 9/2010 | Gorbachov .............. H04B 1/48 370/280 |
| 2016/0127016 | A1 | 5/2016 | Pehlke et al. |
| 2017/0093442 | A1 | 3/2017 | Jayaraman et al. |
| 2018/0351594 | A1* | 12/2018 | Wloczysiak ............ H03F 3/245 |
| 2019/0074819 | A1 | 3/2019 | Goto et al. |
| 2019/0229775 | A1 | 7/2019 | Wloczysiak |
| 2020/0162114 | A1 | 5/2020 | King et al. |
| 2020/0366325 | A1 | 11/2020 | Medra et al. |
| 2021/0194511 | A1 | 6/2021 | Chang et al. |
| 2022/0247478 | A1 | 8/2022 | Wloczysiak |
| 2023/0020586 | A1 | 1/2023 | Kasnavi et al. |
| 2023/0088469 | A1 | 3/2023 | Raghavan |
| 2023/0107261 | A1 | 4/2023 | Raghavan |
| 2023/0188165 | A1 | 6/2023 | Xu et al. |
| 2023/0216527 | A1 | 7/2023 | Raghavan |
| 2023/0223928 | A1 | 7/2023 | Ochiai |
| 2023/0269060 | A1 | 8/2023 | Leung |

OTHER PUBLICATIONS

Skyworks Solutions, Inc. (2020). *SKY53735-21 Sky5: LB/MLB / MB / HB and MIMO Diversity Module.*

* cited by examiner mXn DL MIMO nXm UL MIMO

FRONT-END RECEIVER WITH MULTI-STAGE, TIERED BANDWIDTH AMPLIFIERS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field of the Invention

The present disclosure relates to radio frequency front-end architectures for wireless applications.

Description of the Related Art

In wireless applications, a transmit signal is typically generated by a transceiver, amplified by a power amplifier, filtered by a filter, and routed to an antenna by a switch network. Such a signal transmitted through the antenna has a relatively high power.

In a generally reverse manner, a relatively weak signal received through an antenna is typically routed from the antenna by a switch network, filtered by a filter, amplified by a low-noise amplifier, and provided to the transceiver. In some applications, the amplification can be achieved close to the antenna to reduce loss of the relatively weak signal.

Modern mobile telecommunications standards continue to demand increasingly greater rates and reliability of data exchange.

SUMMARY

One way to achieve a high data rate in a mobile device is through the use of carrier aggregation (CA). Carrier aggregation allows a single mobile device to aggregate bandwidth across one or more operating bands in the wireless spectrum. The increased bandwidth achieved as a result of carrier aggregation allows a mobile device to obtain higher data rates than have previously been available.

Similarly, multiple-input and multiple-output (MIMO) is a method to expand the capacity of data exchange through the use of parallel transmit and receive antennas. Using multiplexing techniques, MIMO allows a transmitter to send multiple data streams by multiple transmit antennas of various frequency bands which are received by multiple receive antennas and coupled to a receiver.

Disclosed are diversity receive front-end architectures with carrier aggregation and MIMO support. The front-end architecture provides high rates of wireless data exchange and extensive band coverage while mitigating losses and providing a reduced number of components.

In some aspects, the techniques described herein relate to a radio frequency front end module including: a plurality of initial amplification stages each configured to amplify a corresponding radio frequency receive signal; a first secondary amplification stage and a first switch, the first switch configured to receive intermediate amplified outputs from at least two of the initial amplification stages and to selectively output one of the intermediate amplified outputs to an input of the first secondary amplification stage; and a second secondary amplification stage and a second switch, the second switch configured to receive intermediate amplified outputs from at least two of the initial amplification stages and to selectively output one of the intermediate amplified outputs to an input of the second secondary amplification stage, one or more of the intermediate amplified outputs received by the first switch also received by the second switch.

In some aspects, the techniques described herein relate to a radio frequency front end module wherein the first switch is configured to receive intermediate amplified outputs from at least three of the initial amplification stages and to selectively output one of the intermediate amplified outputs to the input of the first secondary amplification stage, and the second switch is configured to receive intermediate amplified outputs from at least three of the initial amplification stages and to selectively output one of the intermediate amplified outputs to the input of the second secondary amplification stage.

In some aspects, the techniques described herein relate to a radio frequency front end module wherein two or more of the intermediate amplified outputs received by the first switch are also received by the second switch.

In some aspects, the techniques described herein relate to a radio frequency front end module further including a first tunable matching circuit connected to an output of the first secondary amplification stage and dynamically tunable based on which of the intermediate amplified outputs are selectively output by the first switch, and a second tunable matching circuit connected to an output of the second secondary amplification stage and dynamically tunable based on which of the intermediate amplified outputs are selectively output by the second switch.

In some aspects, the techniques described herein relate to a radio frequency front end module further including a plurality of filters, each of the plurality of filters connected to a corresponding initial amplification stage of the plurality of amplification stages, each of the plurality of filters having a different passband.

In some aspects, the techniques described herein relate to a radio frequency front end module wherein the first secondary amplification stage has a first operational frequency range that encompasses the passbands of each of the filters connected to the at least two of the initial amplification stages that output the intermediate amplified outputs received by the first switch, and the second secondary amplification stage has a second operational frequency range that encompasses the passbands of each of the filters connected to the at least two of the initial amplification stages that output the intermediate amplified outputs received by the second switch.

In some aspects, the techniques described herein relate to a radio frequency front end module wherein the first secondary amplification stage has a first operational frequency range that is wider than any of operational frequency range of the at least two of the initial amplification stages that output the intermediate amplified outputs received by the first switch, and the second secondary amplification stage has a second operational frequency range that is wider than any operational frequency range of the at least two of the initial amplification stages that output the intermediate amplified outputs received by the second switch.

In some aspects, the techniques described herein relate to a radio frequency front end system including: first and second antennas; and first and second radio frequency sub-systems connected to the first and second antennas respectively, each of the first and second radio frequency sub-systems including a plurality of initial amplification stages, first and second secondary amplification stages, and first and second switches, the first switch configured to receive intermediate amplified outputs from at least two of the initial amplification stages and to selectively output one of the intermediate amplified outputs to an input of the first secondary amplification stage, the second switch configured to receive intermediate amplified outputs from at least two of the initial amplification stages and to selectively output one of the intermediate amplified outputs to an input of the second secondary amplification stage, one or more of the intermediate amplified outputs received by the first switch also received by the second switch.

In some aspects, the techniques described herein relate to a radio frequency front end system wherein the first radio frequency sub-system is configured to aggregate at least two component carriers for downlink, and the second radio frequency sub-system is also configured to aggregate the at least two component carriers for downlink.

In some aspects, the techniques described herein relate to a radio frequency front end system wherein the first radio frequency sub-system implements a diversity path and the second radio frequency sub-system implements a multi-input multi-output path.

In some aspects, the techniques described herein relate to a radio frequency front end system further including a third radio frequency sub-system that implements a primary path configured to aggregate the at least two component carriers for downlink and that also implements uplink functionality.

In some aspects, the techniques described herein relate to a radio frequency front end system wherein the primary path aggregates at least four component carriers, the diversity path also aggregates the at least four component carriers, and the multi-input multi-output path aggregates at least a subset of the at least four component carriers.

In some aspects, the techniques described herein relate to a radio frequency front end system wherein the first switch is configured to receive intermediate amplified outputs from at least three of the initial amplification stages and to selectively output one of the intermediate amplified outputs to the input of the first secondary amplification stage, and the second switch is configured to receive intermediate amplified outputs from at least three of the initial amplification stages and to selectively output one of the intermediate amplified outputs to the input of the second secondary amplification stage.

In some aspects, the techniques described herein relate to a radio frequency front end system wherein two or more of the intermediate amplified outputs received by the first switch are also received by the second switch.

In some aspects, the techniques described herein relate to a radio frequency front end system further including a first tunable matching circuit connected to an output of the first secondary amplification stage and dynamically tunable based on which of the intermediate amplified outputs are selectively output by the first switch, and a second tunable matching circuit connected to an output of the second secondary amplification stage and dynamically tunable based on which of the intermediate amplified outputs are selectively output by the second switch.

In some aspects, the techniques described herein relate to a radio frequency front end system further including a plurality of filters, each of the plurality of filters connected to a corresponding initial amplification stage of the plurality of amplification stages, each of the plurality of filters having a different passband.

In some aspects, the techniques described herein relate to a radio frequency front end system wherein the first secondary amplification stage has a first operational frequency range that encompasses the passbands of each of the filters connected to the at least two of the initial amplification stages that output the intermediate amplified outputs received by the first switch, and the second secondary amplification stage has a second operational frequency range that encompasses the passbands of each of the filters connected to the at least two of the initial amplification stages that output the intermediate amplified outputs received by the second switch.

In some aspects, the techniques described herein relate to a radio frequency front end system wherein the first secondary amplification stage has a first operational frequency range that is wider than any of the operational frequency ranges of the at least two of the initial amplification stages that output the intermediate amplified outputs received by the first switch, and the second secondary amplification stage has a second operational frequency range that is wider than any of the operational frequency ranges the at least two of the initial amplification stages that output the intermediate amplified outputs received by the second switch.

In some aspects, the techniques described herein relate to a mobile device including: first and second antennas; a primary path radio frequency sub-system connected to the first antenna and configured to support uplink and downlink for at least two radio frequency bands, and to support carrier aggregation for at least the downlink; and a diversity path radio frequency sub-system connected to the second antenna and configured to support downlink carrier aggregation, the diversity path radio frequency sub-system including a plurality of initial amplification stages, first and second secondary amplification stages, and first and second switches, the first switch configured to receive intermediate amplified outputs from at least two of the initial amplification stages and to selectively output one of the intermediate amplified outputs to an input of the first secondary amplification stage, the second switch configured to receive intermediate amplified outputs from at least two of the initial amplification stages and to selectively output one of the intermediate amplified outputs to an input of the second secondary amplification stage, one or more of the intermediate amplified outputs received by the first switch also received by the second switch.

In some aspects, the techniques described herein relate to a mobile device wherein the first switch is configured to receive intermediate amplified outputs from at least three of the initial amplification stages and to selectively output one of the intermediate amplified outputs to the input of the first secondary amplification stage, the second switch is configured to receive intermediate amplified outputs from at least three of the initial amplification stages and to selectively output one of the intermediate amplified outputs to the input of the second secondary amplification stage.

In some aspects, the techniques described herein relate to a mobile device wherein two or more of the intermediate amplified outputs received by the first switch are also received by the second switch.

In some aspects, the techniques described herein relate to a radio frequency front end module including: a plurality of filters; a plurality of initial amplification stages each having an input connected to a corresponding filter of the plurality of filters, and each configured to amplify a radio frequency receive signal filtered by the corresponding filter; and a first secondary amplification stage, a first tunable matching circuit connected to an output of the first secondary amplification stage, and a first switch configured to receive intermediate amplified outputs from at least two of the initial amplification stages and to selectively output one of the intermediate amplified outputs to an input of the first secondary amplification stage, the first tunable matching circuit dynamically tunable based on which of the intermediate amplified outputs are selectively output by the first switch.

In some aspects, the techniques described herein relate to a radio frequency front end module wherein the first tunable matching circuit includes at least one tunable capacitor.

In some aspects, the techniques described herein relate to a radio frequency front end module wherein the first tunable matching circuit includes a network including the tunable capacitor and at least one inductor.

In some aspects, the techniques described herein relate to a radio frequency front end module wherein the first tunable matching circuit is connected between the output of the first secondary amplification stage and ground.

In some aspects, the techniques described herein relate to a radio frequency front end module further including an attenuator circuit connected in series with the output of the first secondary amplification stage.

In some aspects, the techniques described herein relate to a radio frequency front end module wherein the attenuator circuit is dynamically tunable.

In some aspects, the techniques described herein relate to a radio frequency module further including a second secondary amplification stage, a second tunable matching circuit connected to an output of the second secondary amplification stage, and a second switch configured to receive intermediate amplified outputs from at least two of the initial amplification stages and to selectively output one of the intermediate amplified outputs to an input of the second secondary amplification stage, the second tunable matching circuit dynamically tunable based on which of the intermediate amplified outputs are selectively output by the second switch.

In some aspects, the techniques described herein relate to a radio frequency module wherein the first secondary amplification stage has a first operational frequency range that encompasses passbands of each of the filters connected to the at least two of the initial amplification stages that output the intermediate amplified outputs received by the first switch, and the second secondary amplification stage has a second operational frequency range that encompasses the passbands of each of the filters connected to the at least two of the initial amplification stages that output the intermediate amplified outputs received by the second switch.

In some aspects, the techniques described herein relate to a radio frequency module wherein the first secondary amplification stage has a first operational frequency range that is wider than any of the operational frequency ranges of the at least two of the initial amplification stages that output the intermediate amplified outputs received by the first switch, and the second secondary amplification stage has a second operational frequency range that is wider than any of the operational frequency ranges of the at least two of the initial amplification stages that output the intermediate amplified outputs received by the second switch.

In some aspects, the techniques described herein relate to a radio frequency front end system including: first and second radio frequency sub-systems connected to first and second antennas respectively, each of the first and second radio frequency sub-systems including a plurality of filters, a plurality of initial amplification stages each having an input connected to a corresponding filter of the plurality of filters and configured to amplify a signal filter by the corresponding filter, each of the first and second radio frequency sub-system further including a first secondary amplification stage, a first tunable matching circuit connected to an output of the first secondary amplification stage, and a first switch configured to receive intermediate amplified outputs from at least two of the initial amplification stages and to selectively output one of the intermediate amplified outputs to an input of the first secondary amplification stage, the first tunable matching circuit dynamically tunable based on which of the intermediate amplified outputs are selectively output by the first switch.

In some aspects, the techniques described herein relate to a radio frequency front end system wherein the first tunable matching circuit includes at least one tunable capacitor.

In some aspects, the techniques described herein relate to a radio frequency front end system wherein the first tunable matching circuit includes a network including the tunable capacitor and at least one inductor.

In some aspects, the techniques described herein relate to a radio frequency front end system wherein the first tunable matching circuit is connected between the output of the first secondary amplification stage and ground.

In some aspects, the techniques described herein relate to a radio frequency front end system further including an attenuator circuit connected to in series with the output of the first secondary amplification stage.

In some aspects, the techniques described herein relate to a radio frequency front end system wherein the attenuator circuit is dynamically tunable.

In some aspects, the techniques described herein relate to a radio frequency front end system wherein each of the first and second radio frequency sub-systems further includes a second secondary amplification stage, a second tunable matching circuit connected to an output of the second secondary amplification stage, and a second switch configured to receive intermediate amplified outputs from at least two of the initial amplification stages and to selectively output one of the intermediate amplified outputs to an input of the second secondary amplification stage, the second tunable matching circuit dynamically tunable based on which of the intermediate amplified outputs are selectively output by the second switch.

In some aspects, the techniques described herein relate to a radio frequency front end system wherein the first radio frequency sub-system is configured to aggregate at least two component carriers for downlink, and the second radio frequency sub-system is also configured to aggregate the at least two component carriers for downlink.

In some aspects, the techniques described herein relate to a radio frequency front end system wherein the first radio frequency sub-system implements a diversity path and the second radio frequency sub-system implements a multi-input multi-output path.

In some aspects, the techniques described herein relate to a radio frequency front end system further including a third radio frequency sub-system that implements a primary path configured to aggregate the at least two component carriers for downlink and that also implements uplink functionality.

In some aspects, the techniques described herein relate to a radio frequency front end system wherein the primary path aggregates at least four component carriers, the diversity path also aggregates the at least four component carriers, and the multi-input multi-output path aggregates at least a subset of the at least four component carriers.

In some aspects, the techniques described herein relate to a radio frequency front end system wherein the first secondary amplification stage has a first operational frequency range that encompasses passbands of each of the filters connected to the at least two of the initial amplification stages that output the intermediate amplified outputs received by the first switch, and the second secondary amplification stage has a second operational frequency range that encompasses the passbands of each of the filters connected to the at least two of the initial amplification stages that output the intermediate amplified outputs received by the second switch.

In some aspects, the techniques described herein relate to a radio frequency front end system wherein the first secondary amplification stage has a first operational frequency range that is wider than any of the operational frequency ranges of the at least two of the initial amplification stages that output the intermediate amplified outputs received by the first switch, and the second secondary amplification stage has a second operational frequency range that is wider than any of the operational frequency ranges of the at least two of the initial amplification stages that output the intermediate amplified outputs received by the second switch.

In some aspects, the techniques described herein relate to a mobile device including: first and second antennas; a primary path radio frequency sub-system connected to the first antenna and configured to support uplink and downlink for at least two radio frequency bands, and to support carrier aggregation for at least the downlink; and a diversity path radio frequency sub-system connected to the second antenna and configured to support downlink carrier aggregation, the diversity path radio frequency sub-system including a plurality of filters, a plurality of initial amplification stages each having an input connected to a corresponding filter of the plurality of filters and configured to amplify a signal filter by the corresponding filter, each of the first and second radio frequency sub-system further including a first secondary amplification stage, a first tunable matching circuit connected to an output of the first secondary amplification stage, and a first switch configured to receive intermediate amplified outputs from at least two of the initial amplification stages and to selectively output one of the intermediate amplified outputs to an input of the first secondary amplification stage, the first tunable matching circuit dynamically tunable based on which of the intermediate amplified outputs are selectively output by the first switch.

In some aspects, the techniques described herein relate to a radio frequency front end module including: a plurality of initial amplification stages each configured to amplify a radio frequency receive signal; and a first secondary amplification stage and a first switch configured to receive intermediate amplified outputs from at least two of the initial amplification stages and to selectively output one of the initial stage outputs to an input of the first secondary amplification stage, the first secondary amplification stage having a first operational frequency range, a first of the at least two initial amplification stages having a second operational frequency range, and a second of the at least two initial amplification stages having a third operational frequency range, the first operational frequency range wider than both of, and encompassing both of, the second and third frequency ranges.

In some aspects, the techniques described herein relate to a radio frequency front end module further including a plurality of filters each having a passband and connected to an input of a corresponding initial amplification stage of the plurality of initial amplification stages, such that the radio frequency receive signal received by each of the initial amplification stages is filtered by a corresponding filter of the plurality of filters.

In some aspects, the techniques described herein relate to a radio frequency front end module wherein the first secondary amplification stage has a first operational frequency range that encompasses the passbands of each of the filters connected to the at least two of the initial amplification stages that output the intermediate amplified outputs received by the first switch.

In some aspects, the techniques described herein relate to a radio frequency front end module further including a second secondary amplification stage and a second switch configured to receive intermediate amplified outputs from at least two of the initial amplification stages and to selectively output one of the initial stage outputs to an input of the second secondary amplification stage, the second secondary amplification stage having a fourth operational frequency range, a first of the at least two initial amplification stages having a fifth operational frequency range, and a second of the at least two second initial amplification stages having a sixth operational frequency range, the fourth operational frequency range wider than both of, and encompassing both of, the fifth and sixth frequency ranges.

In some aspects, the techniques described herein relate to a radio frequency front end module wherein one or more of the intermediate amplified outputs received by the first switch also received by the second switch.

In some aspects, the techniques described herein relate to a radio frequency front end module further including a first tunable matching circuit connected to an output of the first secondary amplification stage and dynamically tunable based on which of the intermediate amplified outputs are selectively output by the first switch, and a second tunable matching circuit connected to an output of the second secondary amplification stage and dynamically tunable based on which of the intermediate amplified outputs are selectively output by the second switch.

In some aspects, the techniques described herein relate to a radio frequency front end module wherein the first tunable matching circuit is connected between the output of the first secondary amplification stage and ground and the second tunable matching circuit is connected between the output of the second secondary amplification stage and ground.

In some aspects, the techniques described herein relate to a radio frequency front end module further including a first tunable attenuator circuit connected in series with the output of the first secondary amplification stage and a second tunable attenuator circuit connected in series with the output of the second secondary amplification stage.

In some aspects, the techniques described herein relate to a radio frequency front end system including: first and second radio frequency sub-systems connected to first and second antennas respectively, each of the first and second radio frequency sub-systems including a plurality of initial amplification stages each configured to amplify a radio frequency receive signal, a first secondary amplification stage, and a first switch configured to receive intermediate amplified outputs from at least two of the initial amplification stages and to selectively output one of the initial stage outputs to an input of the first secondary amplification stage, the first secondary amplification stage having a first operational frequency range, a first of the at least two initial amplification stages having a second operational frequency range, and a second of the at least two initial amplification stages having a third operational frequency range, the first operational frequency range wider than both of, and encompassing both of, the second and third frequency ranges.

In some aspects, the techniques described herein relate to a radio frequency front end system wherein the first radio frequency sub-system is configured to aggregate at least two component carriers for downlink, and the second radio frequency sub-system is also configured to aggregate the at least two component carriers for downlink.

In some aspects, the techniques described herein relate to a radio frequency front end system wherein the first radio frequency sub-system implements a diversity path and the second radio frequency sub-system implements a multi-input multi-output path.

In some aspects, the techniques described herein relate to a radio frequency front end system further including a third radio frequency sub-system that implements a primary path configured to aggregate the at least two component carriers for downlink and that also implements uplink functionality.

In some aspects, the techniques described herein relate to a radio frequency front end system wherein the primary path aggregates at least four component carriers, the diversity path also aggregates the at least four component carriers, and the multi-input multi-output path aggregates at least a subset of the at least four component carriers.

In some aspects, the techniques described herein relate to a radio frequency front end system wherein the first switch is configured to receive intermediate amplified outputs from at least three of the initial amplification stages and to selectively output one of the intermediate amplified outputs to the input of the first secondary amplification stage.

In some aspects, the techniques described herein relate to a radio frequency front end system further including a first tunable matching circuit connected to an output of the first secondary amplification stage and dynamically tunable based on which of the intermediate amplified outputs are selectively output by the first switch.

In some aspects, the techniques described herein relate to a radio frequency front end system further including a plurality of filters, each of the plurality of filters connected to a corresponding initial amplification stage of the plurality of amplification stages, each of the plurality of filters having a different passband.

In some aspects, the techniques described herein relate to a radio frequency front end system wherein each of the first and second radio frequency sub-systems further includes a second secondary amplification stage and a second switch configured to receive intermediate amplified outputs from at least two of the initial amplification stages and to selectively output one of the initial stage outputs to an input of the second secondary amplification stage, one or more of the intermediate amplified outputs received by the first switch also received by the second switch.

In some aspects, the techniques described herein relate to a mobile device including: first and second antennas; a primary path radio frequency sub-system connected to the first antenna and configured to support uplink and downlink for at least two radio frequency bands, and to support carrier aggregation for at least the downlink; and a diversity path radio frequency sub-system connected to the second antenna and configured to support downlink carrier aggregation, the diversity path radio frequency sub-system including a plurality of initial amplification stages each configured to amplify a radio frequency receive signal, a first secondary amplification stage, and a first switch configured to receive intermediate amplified outputs from at least two of the initial amplification stages and to selectively output one of the initial stage outputs to an input of the first secondary amplification stage, the first secondary amplification stage having a first operational frequency range, a first of the at least two initial amplification stages having a second operational frequency range, and a second of the at least two initial amplification stages having a third operational frequency range, the first operational frequency range wider than both of, and encompassing both of, the second and third frequency ranges.

In some aspects, the techniques described herein relate to a mobile device further including a plurality of filters each having a passband and connected to an input of a corresponding initial amplification stage of the plurality of initial amplification stages, such that the radio frequency receive signal received by each of the initial amplification stages is filtered by a corresponding filter of the plurality of filters.

In some aspects, the techniques described herein relate to a mobile device wherein the first secondary amplification stage has a first operational frequency range that encompasses the passbands of each of the filters connected to the at least two of the initial amplification stages that output the intermediate amplified outputs received by the first switch.

DETAILED DESCRIPTION

Figure 1:
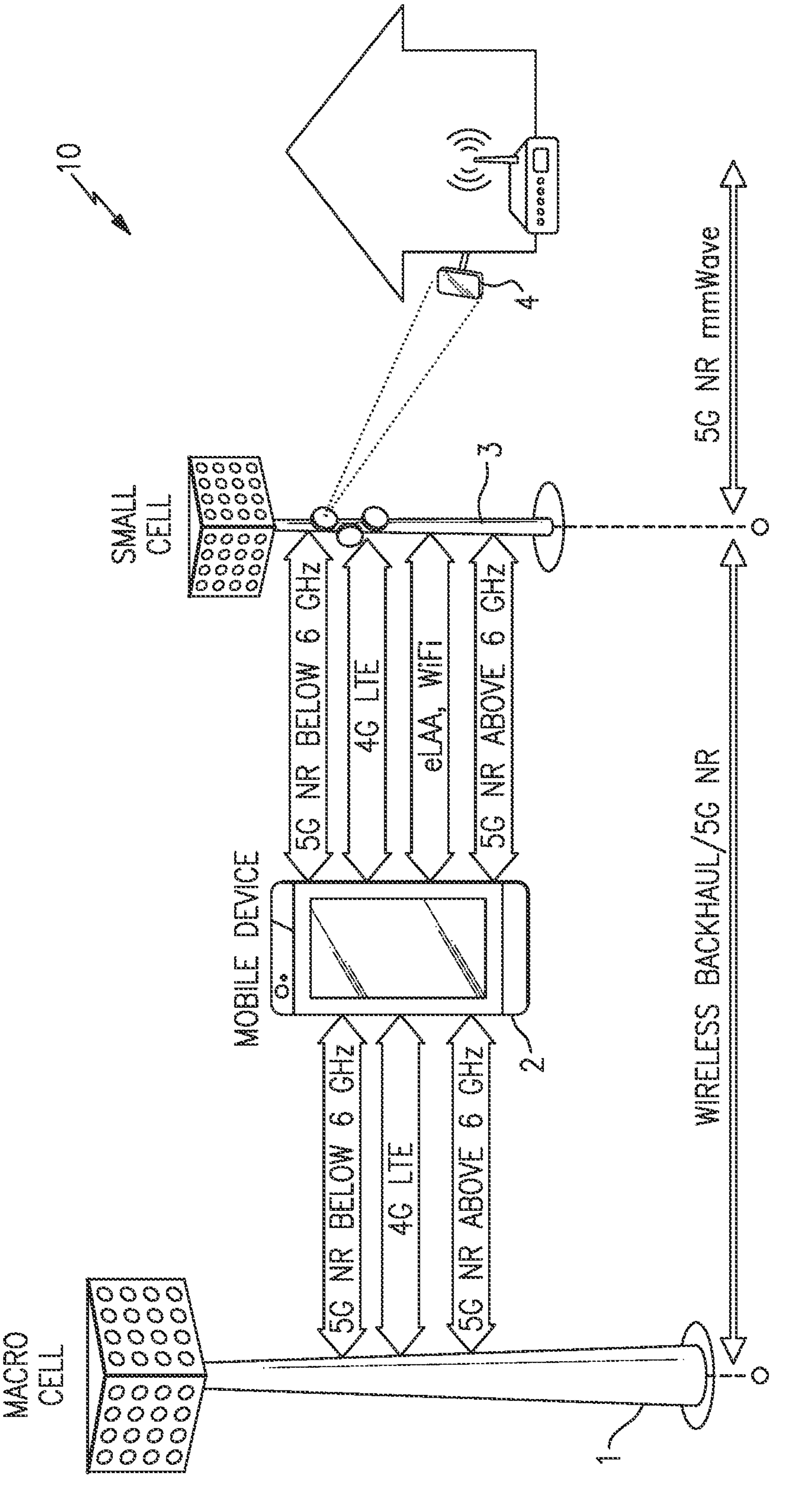
FIG. 1 is a schematic diagram of one example of a mobile device communicating via cellular and WiFi networks.

The following detailed description presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a mobile device 2, a small cell base station 3, and a stationary wireless device 4.

The illustrated communication network 10 of FIG. 1 supports communications using a variety of technologies, including, for example, 4G LTE, 5G NR, and wireless local area network (WLAN), such as WiFi. Although various examples of supported communication technologies are shown, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

As shown in FIG. 1, the mobile device 2 communicates with the macro cell base station 1 over a communication link that uses a combination of 4G LTE and 5G NR technologies. The mobile device 2 also communications with the small cell base station 3. In the illustrated example, the mobile device 2 and small cell base station 3 communicate over a communication link that uses 5G NR, 4G LTE, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

In certain implementations, the mobile device 2 communicates with the macro cell base station 2 and the small cell base station 3 using 5G NR technology over one or more frequency bands that are less than 6 Gigahertz (GHz) and/or over one or more frequency bands that are greater than 6 GHz. For example, wireless communications can utilize Frequency Range 1 (FR1) in the range of about 410 MHz to about 7.125 GHz, Frequency Range 2 (FR2) in the range of about 24.250 GHz to about 52.600 GHz, or a combination thereof. In one embodiment, the mobile device 2 supports a HPUE power class specification.

The illustrated small cell base station 3 also communicates with a stationary wireless device 4. The small cell base station 3 can be used, for example, to provide broadband service using 5G NR technology. In certain implementations, the small cell base station 3 communicates with the stationary wireless device 4 over one or more millimeter wave frequency bands in the frequency range of 30 GHz to 300 GHz and/or upper centimeter wave frequency bands in the frequency range of 24 GHz to 30 GHz.

In certain implementations, the small cell base station 3 communicates with the stationary wireless device 4 using beamforming. For example, beamforming can be used to focus signal strength to overcome path losses, such as high loss associated with communicating over millimeter wave frequencies.

The communication network 10 of FIG. 1 includes the macro cell base station 1 and the small cell base station 3. In certain implementations, the small cell base station 3 can operate with relatively lower power, shorter range, and/or with fewer concurrent users relative to the macro cell base station 1. The small cell base station 3 can also be referred to as a femtocell, a picocell, or a microcell.

Although the communication network 10 is illustrated as including two base stations, the communication network 10 can be implemented to include more or fewer base stations and/or base stations of other types. As shown in FIG. 1, base stations can communicate with one another using wireless communications to provide a wireless backhaul. Additionally or alternatively, base stations can communicate with one another using wired and/or optical links.

The communication network 10 of FIG. 1 is illustrated as including one mobile device and one stationary wireless device. The mobile device 2 and the stationary wireless device 4 illustrate two examples of user devices or user equipment (UE). Although the communication network 10 is illustrated as including two user devices, the communication network 10 can be used to communicate with more or fewer user devices and/or user devices of other types. For example, user devices can include mobile phones, tablets, laptops, IoT devices, wearable electronics, and/or a wide variety of other communications devices.

User devices of the communication network 10 can share available network resources (for instance, available frequency spectrum) in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user device a unique code, space-divisional multiple access (SDMA) in which beamforming is used to provide shared access by spatial division, and non-orthogonal multiple access (NOMA) in which the power domain is used for multiple access. For example, NOMA can be used to serve multiple user devices at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user device. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to eMBB, uRLLC, and/or mMTC.

A peak data rate of a communication link (for instance, between a base station and a user device) depends on a variety of factors. For example, peak data rate can be affected by channel bandwidth, modulation order, a number of component carriers, and/or a number of antennas used for communications.

For instance, in certain implementations, a data rate of a communication link can be about equal to $M*B*\log_2(1+S/N)$, where M is the number of communication channels, B is the channel bandwidth, and S/N is the signal-to-noise ratio (SNR).

Accordingly, data rate of a communication link can be increased by increasing the number of communication channels (for instance, transmitting and receiving using multiple antennas), using wider bandwidth (for instance, by aggregating carriers), and/or improving SNR (for instance, by increasing transmit power and/or improving receiver sensitivity).

5G NR communication systems can employ a wide variety of techniques for enhancing data rate and/or communication performance.

Figure 2B:
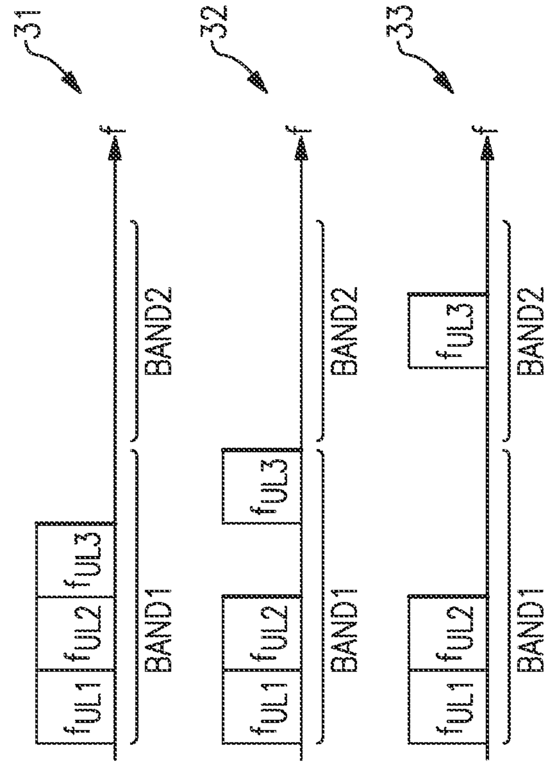
FIG. 2B illustrates various examples of uplink carrier aggregation for the communication link of FIG. 2A.
Figure 2A:
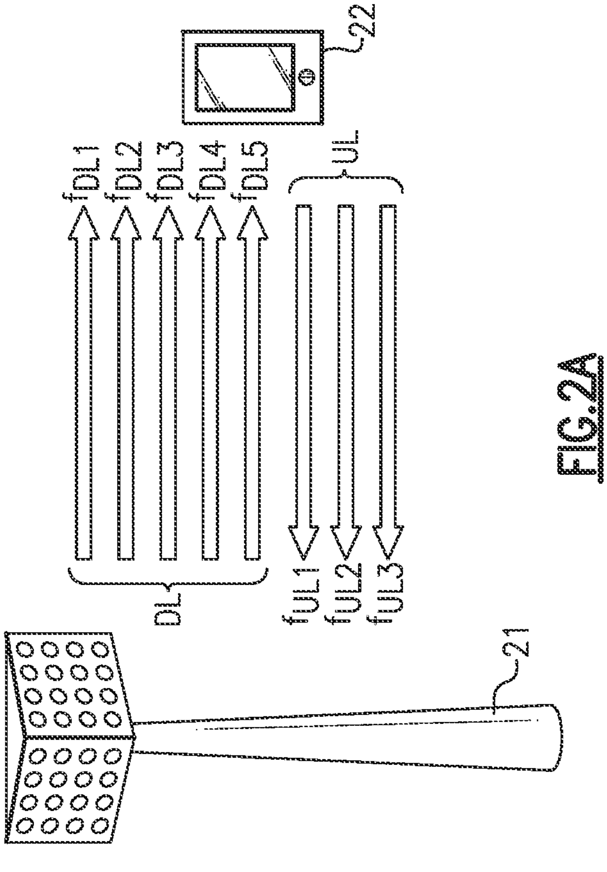
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
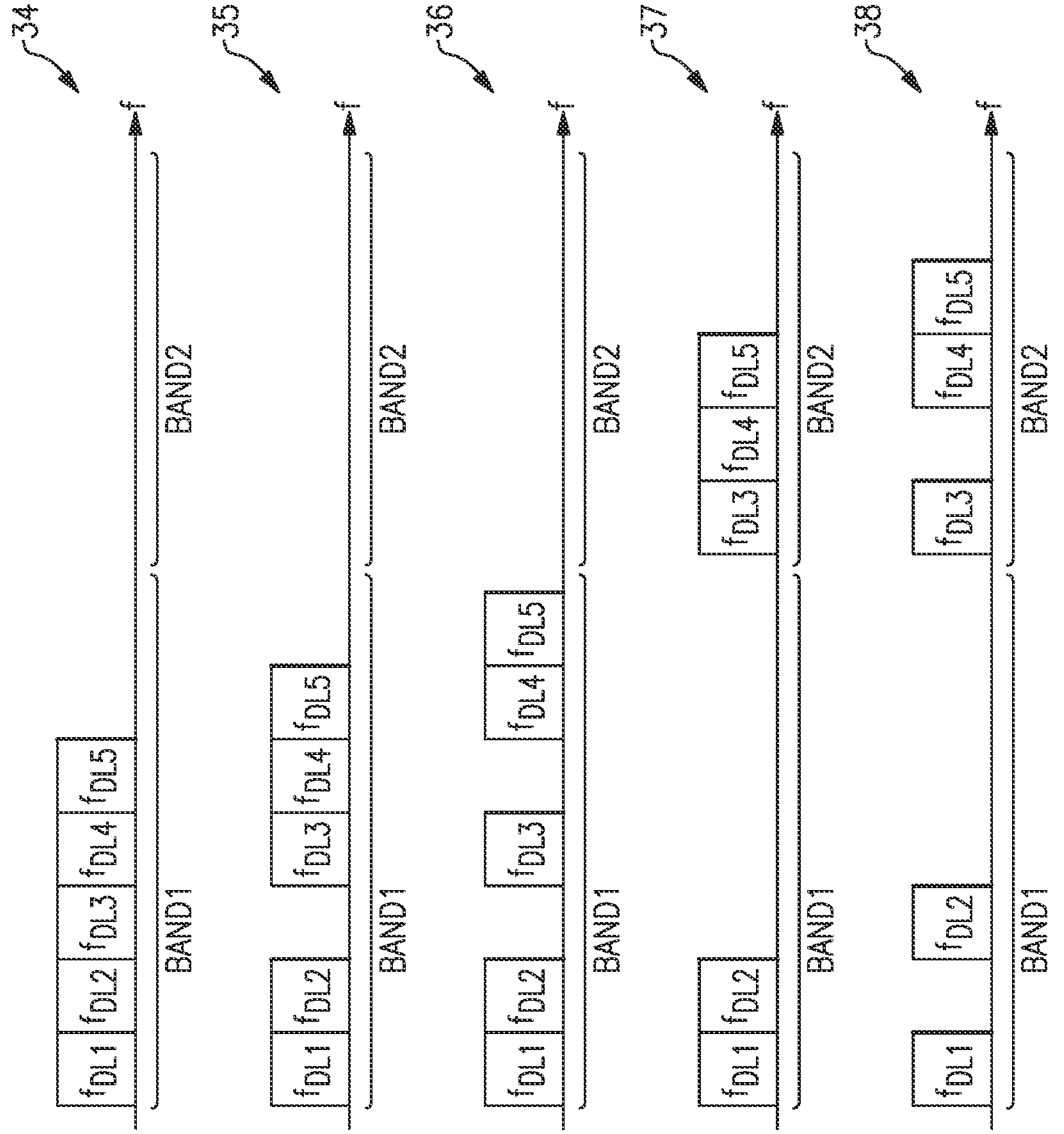
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Figure 3A:
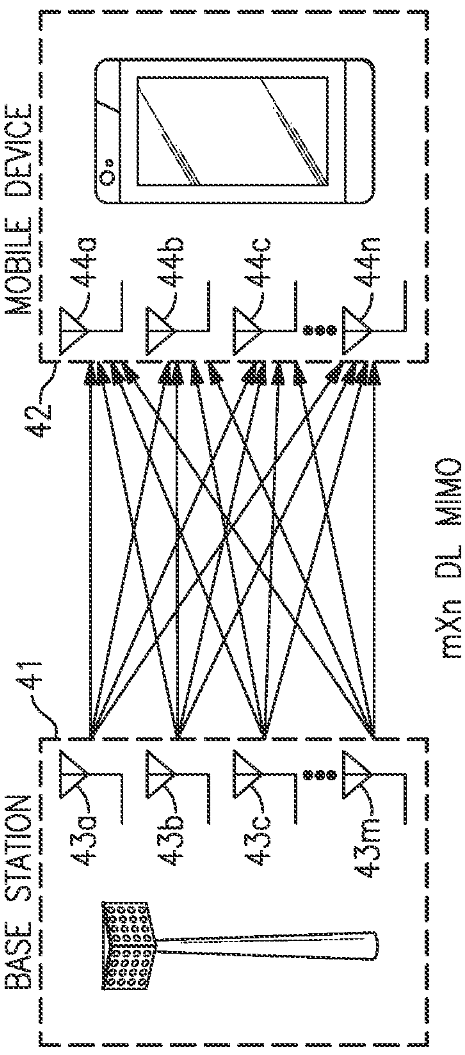
FIG. 3A is a schematic diagram of one example of a downlink channel using MIMO communications.
Figure 3B:
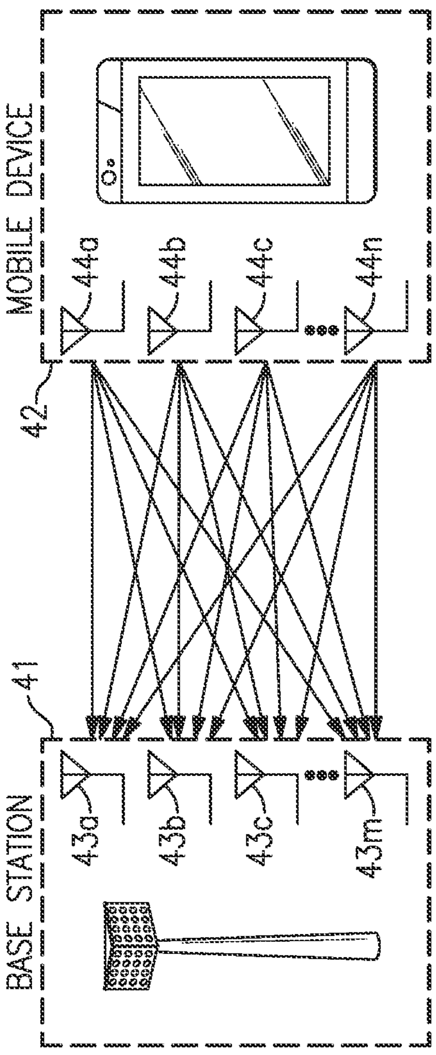
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43$a$, 43$b$, 43$c$, . . . 43$m$ of the base station 41 and receiving using N antennas 44$a$, 44$b$, 44$c$, . . . 44$n$ of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44$a$, 44$b$, 44$c$, . . . 44$n$ of the mobile device 42 and receiving using M antennas 43$a$, 43$b$, 43$c$, . . . 43$m$ of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Front-End Architecture with Support for Carrier Aggregation and MIMO

Described herein are various examples related to radio-frequency (RF) front-end architectures for operations of a wireless device having multiple antennas. For example, such a wireless device can include two, three, or four antennas. Although various examples are described in the context of four antennas, it will be understood that one or more features of the present disclosure can also be implemented for wireless devices having other numbers of antennas. It will also be understood that not all of such four antennas necessarily need to be utilized when one or more features of the present disclosure is/are implemented in the wireless device.

Downlink carrier aggregation (DL CA) combines two or more wireless (e.g., LTE) signals (component carriers), received (downlinked), e.g., from a wireless base station to a single user device, dramatically increasing the speed with which a user can download content and files. MIMO uses multiple antennas at both the source (transmitter) and the destination (receiver). The antennas at each end of the communications circuit are combined to reduce or minimize errors and to enhance or optimize data speed.

Figure 4A:
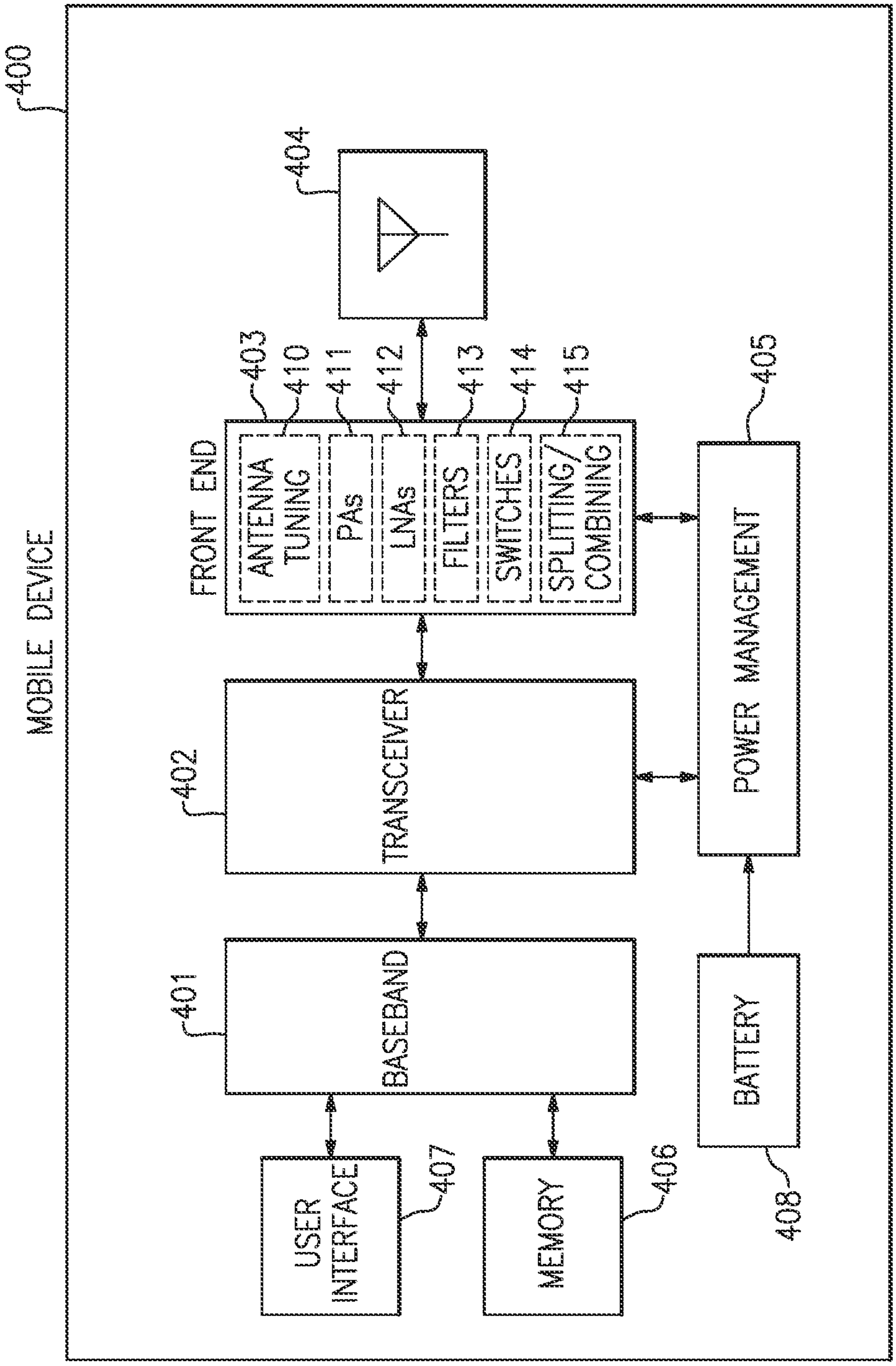
FIG. 4A is a schematic diagram of one embodiment of a mobile device.

FIG. 4A is a schematic diagram of one embodiment of a mobile device 400. The mobile device 400 includes a baseband system 401, a transceiver 402, a front end system 403, antennas 404, a power management system 405, a memory 406, a user interface 407, and a battery 408.

The mobile device 400 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 402 generates RF signals for transmission and processes incoming RF signals received from the antennas 404. It will be understood that various functionalities associated with the transmission and receiving of RF signals can be achieved by one or more components that are collectively represented in FIG. 4A as the transceiver 402. In one example, separate components (for instance, separate circuits or dies) can be provided for handling certain types of RF signals.

The front end system 403 aids in conditioning signals transmitted to and/or received from the antennas 404. In the illustrated embodiment, the front-end 403 includes antenna tuning circuitry 410, power amplifiers (PAs) 411, low noise amplifiers (LNAs) 412, filters 413, switches 414, and signal splitting/combining circuitry 415. However, other implementations are possible, as described above. The front end system 403 can be any of the front end systems described herein, including the front end systems described with respect to FIG. 4B, 4C, 5A, 5B, 5C, 5D, 6A, or 6B, for example.

In certain implementations, the mobile device 400 supports carrier aggregation functionality, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 404 can include antennas used for a wide variety of types of communications. For example, the antennas 404 can include antennas for transmitting and/or receiving signals associated with a wide variety of frequencies and communications standards.

In certain implementations, the antennas 404 support MIMO communications functionality and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 400 can operate with beamforming in certain implementations. For example, the front-end 403 can include amplifiers having controllable gain and phase shifters having controllable phase to provide beam formation and directivity for transmission and/or reception of signals using the antennas 404. For example, in the context of signal transmission, the amplitude and phases of the transmit signals provided to the antennas 404 are controlled such that radiated signals from the antennas 404 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 404 from a particular direction. In certain implementations, the antennas 404 include one or more arrays of antenna elements to enhance beamforming.

Referring again to FIG. 4A, the baseband system 401 is coupled to the user interface 407 to facilitate processing of various user input and output (I/O), such as voice and data. The baseband system 401 provides the transceiver 402 with digital representations of transmit signals, which the transceiver 402 processes to generate RF signals for transmission. The baseband system 401 also processes digital representations of received signals provided by the transceiver 402. As shown in FIG. 4A, the baseband system 401 is coupled to the memory 406 to facilitate operation of the mobile device 400.

The memory 406 can be used for a wide variety of purposes, such as storing data and/or instructions to facilitate the operation of the mobile device 400 and/or to provide storage of user information.

The power management system 405 provides a number of power management functions of the mobile device 400. In certain implementations, the power management system 405 includes a PA supply control circuit that controls the supply voltages of the power amplifiers 411. For example, the power management system 405 can be configured to change the supply voltage(s) provided to one or more of the power amplifiers 411 to improve efficiency, such as power added efficiency (PAE).

As shown in FIG. 4A, the power management system 405 receives a battery voltage from the battery 408. The battery 408 can be any suitable battery for use in the mobile device 400, including, for example, a lithium-ion battery.

Figure 4B:
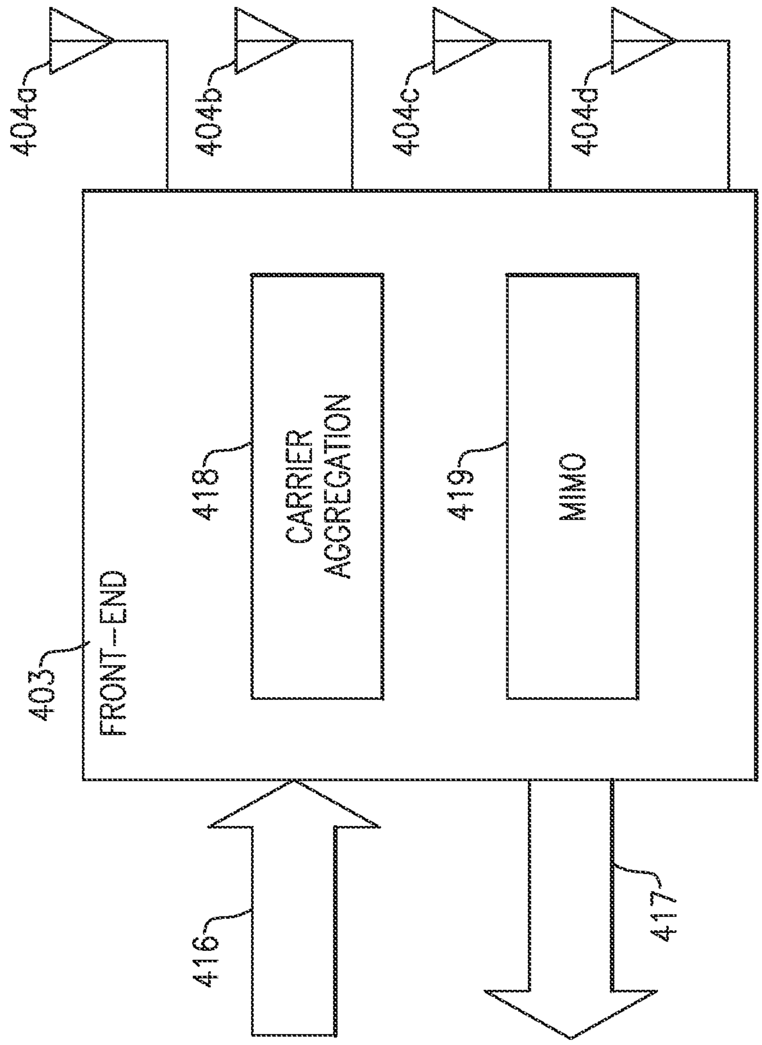
FIG. 4B illustrates a front-end architecture configured to support carrier aggregation and MIMO, according to certain embodiments.

FIG. 4B depicts an example of a front-end 403 having one or more features as described herein, and configured to support multiple antennas. More particularly, the front-end 403 is shown to be coupled to four antennas 404*a*, 404*b*,

404*c*, 404*d*. Each of such antennas can facilitate transmit (TX) and/or receive (RX) operations through the front-end 403.

For transmit operations, the front-end 403 can be in communication with, for example, the transceiver 402 to receive, process, and route one or more transmit signals to one or more of the antennas 404*a*, 404*b*, 404*c*, 404*d*. The one or more transmit signals are collectively depicted as an arrow 416.

For receive operations, the front-end 403 can receive one or more signals from one or more of the antennas 404*a*, 404*b*, 404*c*, 404*d*, process such signal(s), and route such processed signal(s) to, for example, a transceiver 402 which may or may not be the same as the foregoing transceiver 402 associated with the transmit operations. The one or more received signals are collectively depicted as an arrow 417.

As discussed, the front-end 403 can also include a carrier aggregation (CA) functionality provided by one or more modules and/or other components collectively referred to as carrier aggregation architecture 418. Such a carrier aggregation functionality can include an uplink (UL) carrier aggregation (UL CA) functionality and/or a downlink (DL) carrier aggregation (DL CA) functionality. For the purpose of description, it will be understood that in a given carrier aggregation functionality, a plurality of signals associated with the carrier aggregation functionality may or may not share a common antenna or a common signal path. The front-end 403 can also include a multiple input multiple output (MIMO) functionality provided by one or more modules and/or other components collectively referred to as MIMO architecture 419.

The front-end 403 can comprise one or multiple modules (e.g., packaged modules) and/or other componentry, including discrete components. The carrier aggregation architecture 418 and MIMO architecture 419 can be distributed across some or all the modules, depending on the embodiment.

Figure 4C:
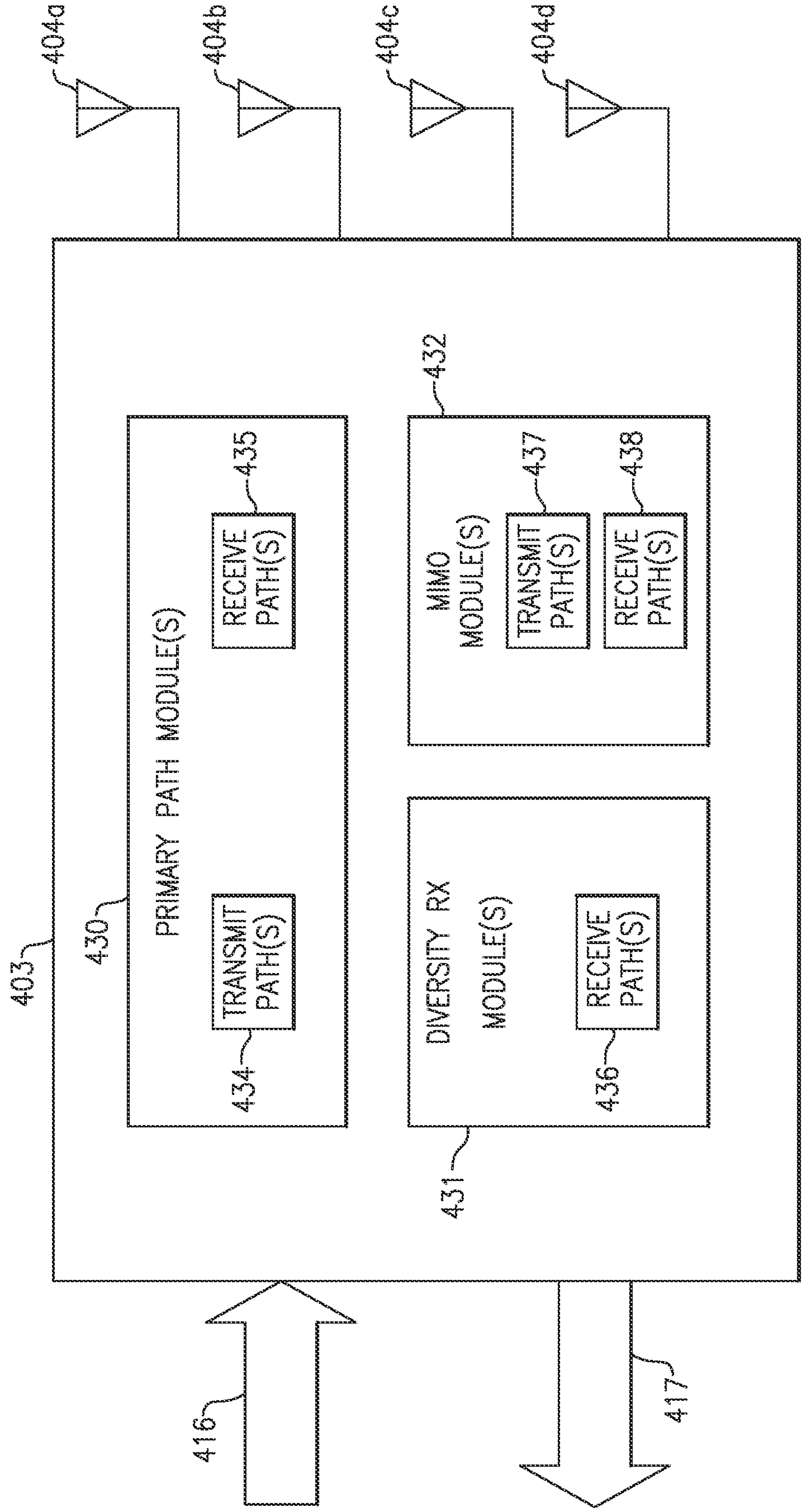
FIG. 4C illustrates a front-end architecture having a primary path module, a diversity receive module, and a MIMO module, according to certain embodiments.

FIG. 4C illustrates an example of a front end system 403 include at least one primary path module 430, at least one diversity receive module 431, and at least one MIMO module 432.

The primary path module 430 can include one or more transmit paths 434 and one or more receive paths 435. Referring also to FIG. 4A, the transmit paths 434 can include a combination of switches 414, transmit power amplifiers 411, filters 413, and other appropriate componentry configured to support signal transmission, e.g., across a plurality of communication bands. The receive paths 435 of the primary path module 430 can similarly include a combination of switches 414, low noise amplifiers 412, filters 413, and other componentry configured to support receiving signals, e.g., across a plurality of communication bands.

The diversity receive module 431 can support one or more diversity receive paths 436 to enhance the receive capability of the mobile device 400. The diversity receive modules 431 can support carrier aggregation and/or MIMO, depending on the implementation. In cases where the diversity receive module 431 supports both carrier aggregation and MIMO, the front end system 403 may or may not include a separate MIMO module 432. In some embodiments, such as where the diversity receive module 431 does not support MIMO functionality, the front end system 403 can include one or more separate MIMO modules 432, which implements one or more transmit paths 437 and receive paths 438. Depending on the embodiment, the MIMO module 432 can implement carrier aggregation in addition to MIMO.

FIGS. 5A-5D illustrate different embodiments of diversity receive modules 431 and/or MIMO modules 432.

Figure 5A:
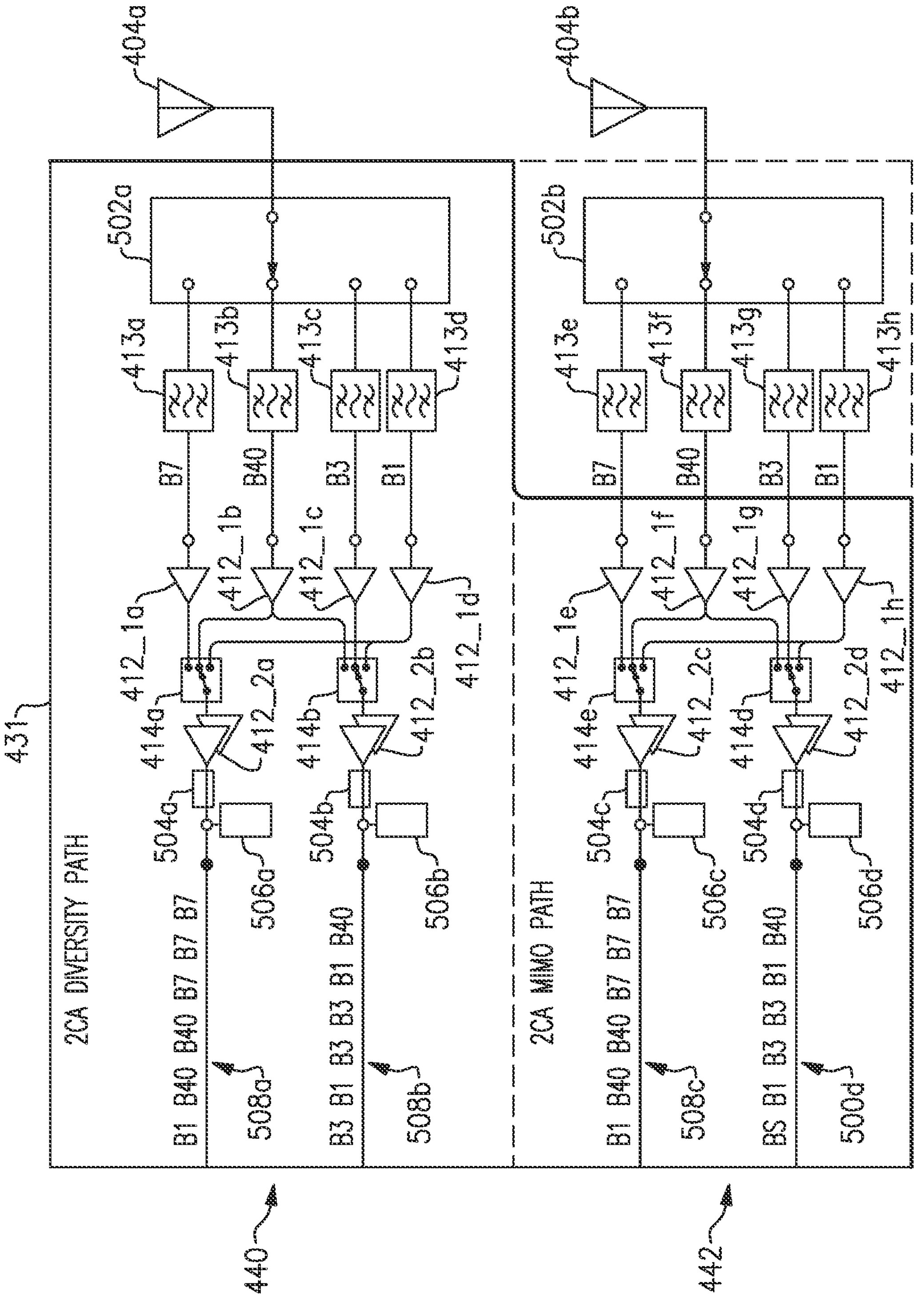
FIGS. 5A-5D illustrate examples of diversity receive and MIMO modules configured for carrier aggregation and MIMO, according to various embodiments.

FIG. 5A illustrates a first embodiment of a portion of a front end system including a diversity receive module 431 having both a carrier aggregation path 440 and a MIMO path 442. The carrier aggregation path 440 implements two band carrier aggregation (2CA) and the MIMO path 442 also implements two band carrier aggregation (2CA). In various embodiments, additional antennas may be connected to the front-end architecture to support additional DRx or MIMO configurations.

The diversity module 431 shows an example of an implementation where each of the diversity path 440 and the MIMO path 442 are configured for selectively receiving any two of the following downlink bands: B1, B3, B7, and B40. Table 3 lists examples of frequency ranges corresponding to the illustrated frequency bands of FIG. 5A. It will be understood that one or more features of the present disclosure can also be implemented to operate with additional or different frequency ranges and bands.

TABLE 3

| Band | Example DL frequency range |
|---|---|
| B7 | 2620-2690 MHz |
| B40 | 2300-2400 MHz |
| B3 | 1805-1880 MHz |
| B1 | 2110-2170 MHz |

The diversity path 440 includes an antenna switch module 502*a* connected to a diversity antenna 404*a*, filters 413*a-d*, initial stage low noise amplifiers 412_1*a-d*, two switches 414*a-b*, secondary stage low noise amplifiers 412_2*a-b*, attenuators 504*a-b*, and tunable matching circuits 506*a-b*. The components are arranged to provide first and second diversity output paths 508*a-b* each outputting signal content corresponding to one of the input bands B7, B40, B3, B1 at a given time.

The filters 413*a-d* can be acoustic filters such as surface acoustic wave (SAW) or bulk acoustic wave (BAW) filters, lumped element inductor-capacitor (LC) based filters, or other types of filters, depending on the implementation.

During operation, a controller of the mobile device 400 can provide a control signal to the antenna switching module 502*a* to cause it to switch between connecting to and providing received signal content to the filters 413*a-d*. The filters 413*a-d* are configured to pass signal content within the designated bands (e.g., filter 413*a*/B7, filter 413*b*/B40, filter 413*c*/B3, and filter 413*d*/B1) to the corresponding initial stage low noise amplifier 412_1*a*, 412_1*b*, 412_1*c*, or 412_1*d*.

Each initial stage low noise amplifier 412_1*a-d* can be configured to amplify signal content across a first, relatively narrow range, corresponding to the frequency range of the assigned frequency band. For example, some or all of the initial stage low noise amplifiers 412_1*a-d* can be tuned to have an operational frequency range corresponding to the first range, such that for signal content outside of the frequency range, the gain of the initial stage low noise amplifier 412_1 drops by a certain threshold amount (e.g., 3 dB) from a maximum gain of the initial stage low noise amplifier 412_1 for signal content within the frequency range. According to various embodiments, the relatively narrow range can be at least as wide as the band assigned to the initial stage low noise amplifier 412_1. In some embodiments, each initial stage low noise amplifier 412_1*a-d* can be designed with some margin to have an operational frequency range somewhat wider than the band assigned to the initial stage low noise amplifier 412_1. For example, some or all of the initial stage low noise amplifiers 412_1*a-d* can be tuned with an operational frequency range width that is anywhere from about 10% to about 20% fractional bandwidth, or anywhere from about 10% to about 20% of the center frequency of the initial stage low noise amplifier 412_1*a-d*. For example, referring to FIG. 5A, the first initial stage low noise amplifier 412_1*a* assigned to B7 can have a center frequency of about 2655 MHz, and, depending on the embodiment, can have an operational frequency range width of anywhere from about 265.5 MHz to about 531 MHz, the second initial stage low noise amplifier 412_1*b* assigned to B40 can have a center frequency of about 2350 MHz, and, depending on the embodiment, can have an operational frequency range width of anywhere from about 235 MHz to about 470 MHz wide, the third initial stage low noise amplifier 412_1*c* assigned to B3 can have a center frequency of about 1842.5 MHz, and, depending on the embodiment, can have an operational frequency range width of anywhere from about 184.25 MHz to about 368.5 MHz, and the fourth initial stage low noise amplifier 412_1*d* assigned to B1 can have a center frequency of about 2140 MHz, and, depending on the embodiment, can have an operational frequency range width of anywhere from about 214 MHz to about 428 MHz.

Each initial stage low noise amplifier 412_1*a-d* can also be tuned to the output impedance of the corresponding filter 413*a-d* to which the initial stage low noise amplifier 412_1*a-d* is connected, which can be about 50 ohms, for example.

Each initial stage low noise amplifier 412_1*a-d* is connected to an input of one or both of the switches 414*a-b*. For example, the first initial stage low noise amplifier 412_1*a* corresponding to band B7 is connected to an input of only the switch 414*a*, the second initial stage low noise amplifier_1*b* corresponding to band B40 is connected to inputs of both of the switches 414*a-b*, the third initial stage low noise amplifier 412_1*c* corresponding to band B3 is connected to an input of only the switch 414*b*, and the fourth initial stage low noise amplifier 412_1*d* corresponding to B1 is connected to inputs of both of the switches 414*a-b*.

The switches 414*a-b* of the illustrated embodiment are three input switches configured to switch between providing the signal received on one of the three inputs to the output of the switch 414*a-b* at any given time. The output of the first switch 414*a* is connected to the first secondary stage low noise amplifier 412_2*a* and the output of the second switch 414*b* is connected to the second secondary stage amplifier 412_2*b*.

In the illustrated embodiment, a controller of the mobile device 400 can be configured to control the switch 414*a* to provide signal content from any of bands B7, B40, or B1 to the first secondary stage low noise amplifier 412_2*a* at a given time, and to control the switch 414*b* to provide signal content from any of bands B40, B3, and B1 to the second secondary stage low noise amplifier 412_2*b* at a given time.

The secondary stage low noise amplifiers 412_2*a-b* can be relatively broadband amplifiers. For example, the secondary stage low noise amplifiers 412_2*a-b* can be configured to support signal frequencies across a wider range than some or all of the initial stage low noise amplifiers 412_1*a-d*. The decoupling of the low noise amplifiers into initial stage low noise amplifiers 412_1*a-d* and secondary stage low noise amplifiers 412_2*a-b* can allow for the relatively broadband secondary stage low noise amplifiers 412-2*a-b* because the Noise Figure (NF) contribution (e.g., according to the Friss equation) of the secondary stage low noise amplifiers 412_2 to the combined low noise amplifier is much less than that of the initial stage low noise amplifier 412_1, and because the secondary stage low noise amplifier 412_2 is not connected directly to the relatively narrow band filters 413*a-d*.

In the illustrated embodiment, in order to support any of connected bands B7, B40, B1, the first secondary stage low noise amplifier 412_2*a* can be configured to support at least signal frequencies from 2110 MHz (lower end of B1 DL range) to 2690 MHz (upper end of B7 DL range). Likewise, the second secondary stage low noise amplifier 412_2*b* can be configured to support at least signal frequencies from 1805 MHz (lower end of B3) to 2400 MHz (upper end of B40).

In some implementations, one or both the secondary stage low noise amplifiers 412_1*a-b* can be tuned with an operational frequency range width that is anywhere from about 40% to about 60% fractional bandwidth, or anywhere from about 40% to about 60% of the center frequency of the secondary stage low noise amplifier 412_2*a-b*. For example, referring to FIG. 5A, the first secondary stage low noise amplifier 412_2*a* can have a center frequency of about 2,500 MHz (mid-point between 2110 MHz and 2690 MHz) and, depending on the embodiment, can have an operational frequency range width of about 1,000 MHz to about 1,500 MHz, and the second secondary stage low noise amplifier 412_2*b* can have a center frequency of about 2,102.5 MHz (mid-point between 1805 MHz and 2400 MHz), and, depending on the embodiment, can have an operational frequency range width of anywhere from about 841 MHz to about 1,261. 5 MHz.

In various implementations, one or both of the secondary stage low noise amplifiers 412_2*a-b* can be configured to support signal frequencies spanning a range of at least 300, 400, 500, 600, 700, 800, 900, or 1000 MHz, or signal frequencies spanning a range that is at least two, three, four, five, six, seven, or eight times as wide as the range supported by some or all of the initial stage low noise amplifiers 412_1 connectable to the respective secondary stage low noise amplifier 412_2.

The attenuators 504*a-b* and/or tunable matching circuits 506*a-b* can be dynamically tuned to improve operation of the diversity path 440.

Depending on the embodiment, the attenuators 504*a-b* can be Pi-type or T-type attenuator circuits with a programmable resistor to achieve programmable attenuation. For instance, the attenuators 504*a-b* can be programmably adjusted to adjust the gain of the receive path 508*a*, 508*b* to compensate for gain difference between paths or align with the signal amplitude at the antenna port. Depending on the embodiment, the baseband processor 401, transceiver 402, or another processor of the mobile device 400 can provide a control signal to the front end module for programming the resistor(s) of the attenuators 504*a-b*, e.g., based on measured gain differences.

The tunable matching circuits 506*a-b* can be programmable to dynamically match the output of the respective secondary low noise amplifier stage 412_2*a-b* to a desired impedance (e.g., 50 ohms) over the operating band frequency range. The tunable matching circuits 506*a-b* can include one or more inductors and capacitors arranged in a network. As an example, the tunable matching circuit can include an inductor in parallel with a capacitor array where the value of the capacitor (e.g., programmable capacitor) is chosen such that the resonance circuit of the LC tank is at the band of interest.

For instance, the attenuators 504*a-b* and/or the tunable matching circuits 506*a-b* can be dynamically tuned based at least in part on the currently active band. The first attenuator 504*a* and/or the first tunable matching circuit 506*a* can be dynamically adjusted depending on which of the three bands B7, B40, B1 connected to the first diversity output path 508*a* is active on the first diversity output path 508*a* at a given time. Similarly, the second attenuator 504*b* and/or the first tunable matching circuit 506*b* can be dynamically adjusted depending on which of the three bands B40, B3, B1 connected to the second diversity output path 508*b* is active on the second diversity output path 508*b* at a given time.

For example, the diversity module 431 or another component of the front end 403 can include a processor or other circuitry that receives (e.g., from the baseband processor 401, transceiver 402, or another processor of the mobile device) as input a control signal representing the currently connected bands, and generates output control signals provided to the capacitor(s) of the tunable matching circuits 506*a-b* to achieve the dynamic tuning.

The MIMO path 442 is connected to a MIMO antenna 404*b*. As shown, the MIMO path 442 of the embodiment illustrated in FIG. 5A is generally a minor of the diversity path 440, and includes a switch module 502*b*, filters 413*e-h*, initial stage low noise amplifiers 412_1*e-h*, switches 414*c-d*, secondary stage low noise amplifiers 414*c-d*, attenuators 504*c-d*, tunable matching circuits 506*c-d*, and output paths 508*c-d*. Similar to the diversity path 440, the MIMO path 442 can be controlled to provide 2CA output on the MIMO output paths 508*c-d*.

In embodiment of FIG. 5A, the diversity path 440 and a portion of the MIMO path 442 reside on the same packaged module, while the remaining portion of the MIMO path 442 resides elsewhere, such as on a phone board of the mobile device 800, or a different packaged module. Specifically, in the illustrated embodiment, as represented by the dashed lines in the lower right portion of FIG. 5A, the switch module 502*b* and filters 413*e-h* of the MIMO path 442 reside on the phone board or are otherwise separate from the packaged diversity receive module 431, while the diversity path 440 and the remaining componentry of the MIMO path 442 resides on the same packaged module, as delineated by the solid line. In some other embodiments, the entire MIMO path 442 resides on the same packaged module as the diversity path 440.

Figure 5B:
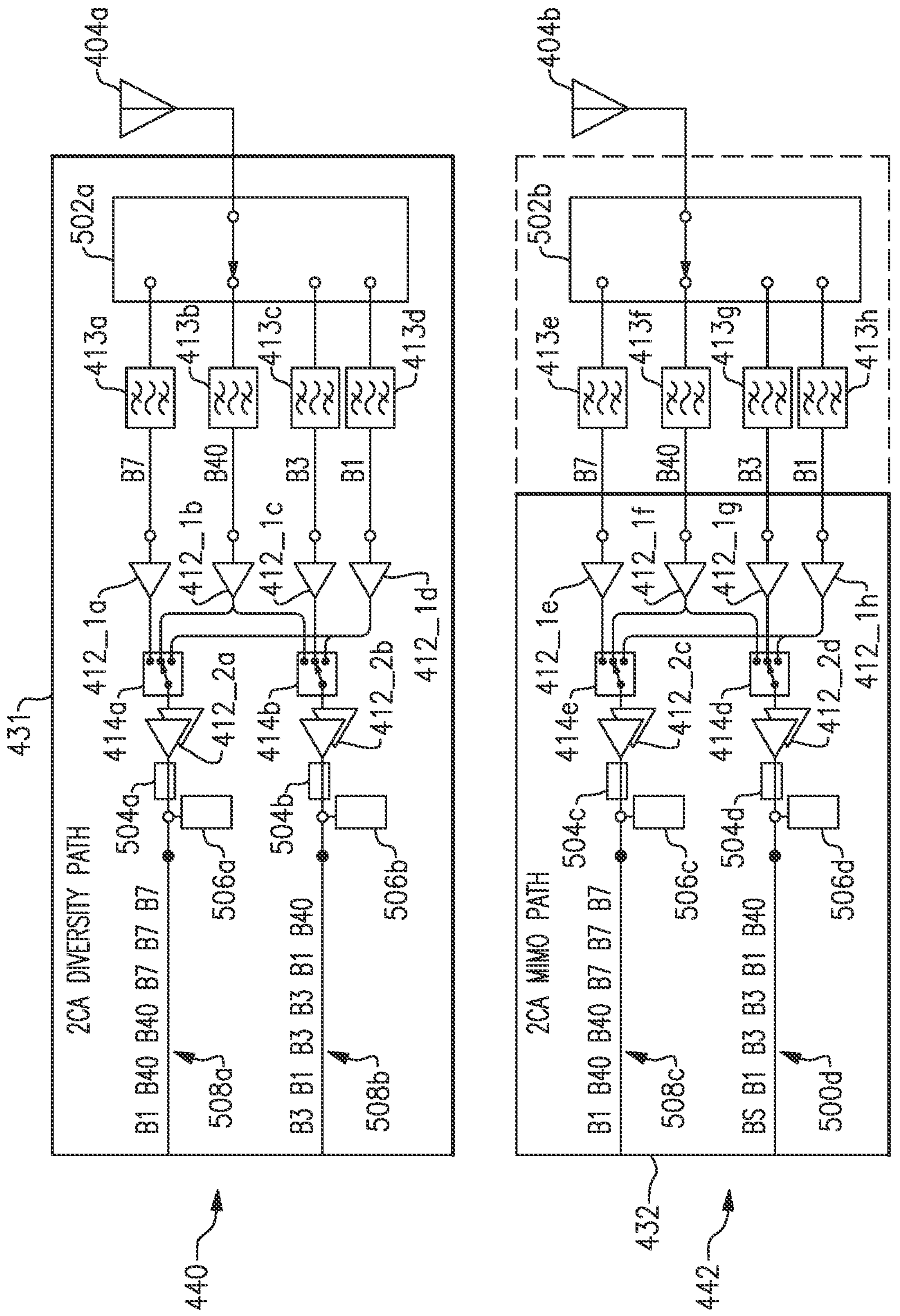

A variety of other implementations are possible. For example, FIG. 5B shows another embodiment of a portion of a front end system 403 including a diversity receive module 431 comprising the diversity path 440 and a separate MIMO module 432 including the MIMO path 442. As illustrated by the dashed lines, a portion of the MIMO path 442 may reside on the phone board rather than on the MIMO module 432 as the rest of the MIMO path 442. In other embodiments, the entire MIMO path 442 may reside on the same module.

Figure 5C:
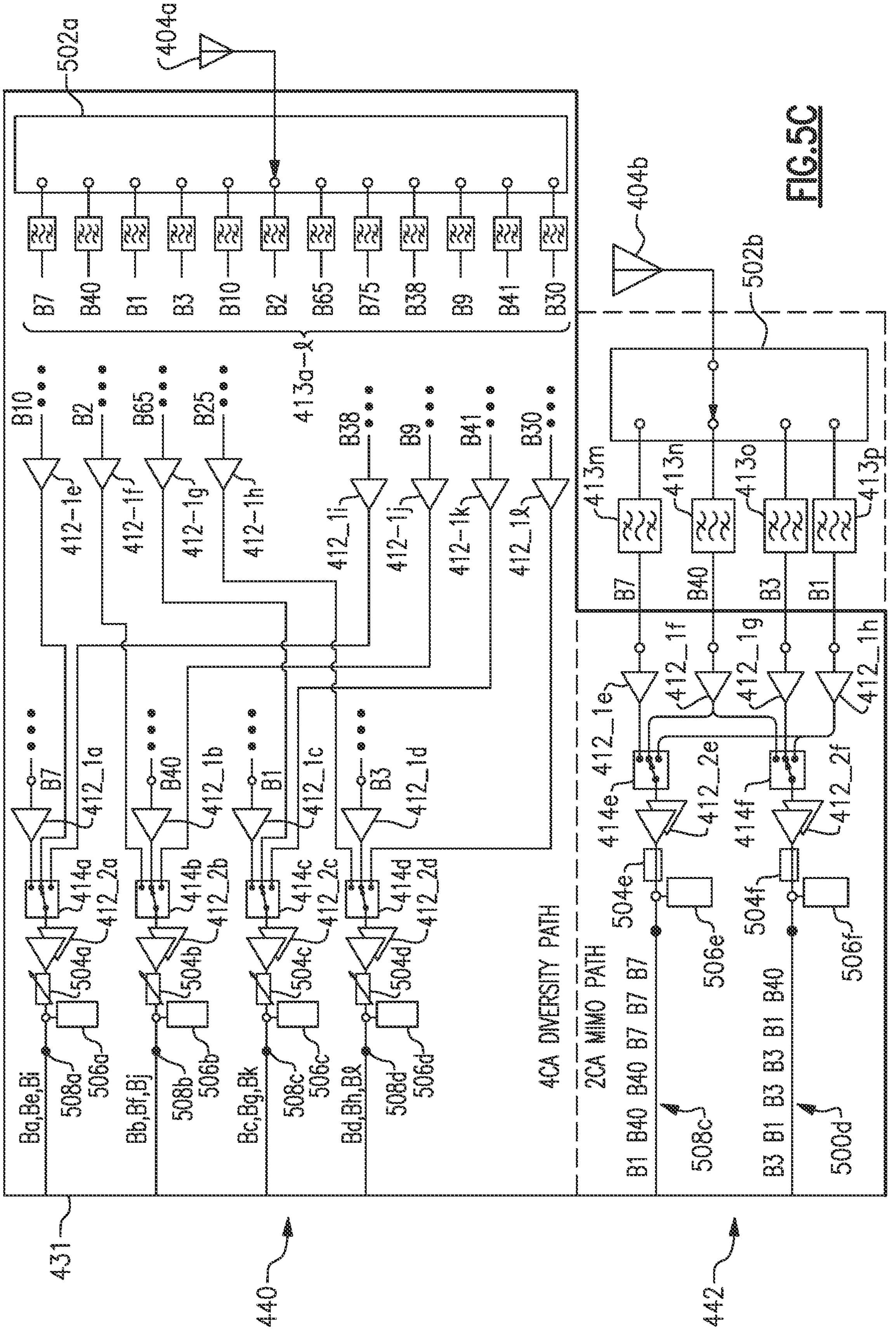

FIG. 5C shows another example of a portion of a front end system including a diversity receive module 431 comprising a diversity path 440 and a MIMO path 442.

Similar to the embodiments shown in FIG. 5A-5B, the MIMO path 442 of the diversity receive module 431 of FIG. 5C_1 implements two band carrier aggregation (2CA) and is similar to the MIMO paths 442 shown in FIGS. 5A-5B.

However, unlike the 2CA diversity receive paths 440 of FIGS. 5A-5B, the diversity receive path 440 of the diversity receive module 431 of FIG. 5C implements four band carrier aggregation (4CA). The diversity path 440 includes an antenna switch module 502*a* connected to a diversity antenna 404*a*, filters 413*a*-1, initial stage low noise amplifiers 412_1*a*-1, switches 414*a-d*, secondary stage low noise amplifiers 412_2*a-d*, attenuators 504*a-d*, and tunable matching circuits 506*a-d*.

The components are arranged to provide four diversity output paths 508*a-d*. As shown, the switches 414*a-d* can include multiple inputs, each connected to a different band. In the illustrated embodiment, each switch 414*a*-414*d* has three inputs each receiving DL signal content from a different band, as follows: the first switch 414*a* receiving B7, B10, and B38, the second switch 414*b* receiving B2, B40, B9, the third switch 414*c* receiving B1, B65, B41, and the fourth switch 414*d* receiving B25, B3, B30.

The filters 413*a*-1 can be acoustic filters such as surface acoustic wave (SAW) or bulk acoustic wave (BAW) filters, lumped element inductor-capacitor (LC) based filters, or other types of filters, depending on the implementation.

During operation, a controller of the mobile device 400 can provide a control signal to the antenna switching module 502*a* to cause it to switch between connecting to and providing received signal content to the filters 413*a*-1, which are configured to pass signal content the corresponding bands to the corresponding initial stage low noise amplifiers 412_1*a*-1.

Each initial stage low noise amplifiers 412_1*a*-1 can be configured to amplify signal content across a first, relatively narrow range, corresponding to the frequency range of the assigned frequency band. Each initial stage low noise amplifier 412_1*a*-1 can also be tuned to the output impedance of the corresponding filter 413*a*-1 to which the initial stage low noise amplifier 412_1*a*-1 is connected.

As shown, each initial stage low noise amplifiers 412_1*a*-1 is connected to an input of one the switches 414*a-d*, respectively. The switches 414*a-d* of the illustrated embodiment are three input switches configured to switch between providing the signal received on one of the three inputs to the output of the switches 414*a-d* at any given time. The outputs of the switches 414*a-d* are each connected to a corresponding one of the secondary stage low noise amplifiers 412_2*a-d*.

Thus, in the illustrated embodiment, a controller of the mobile device 400 can be configured to control the switch 414*a* to provide signal content from any the bands B7, B10, B38 to the first secondary stage low noise amplifier 412_2*a*, to control the switch 414*b* to provide signal content from any of the bands B2, B40, B9 to the second secondary stage low noise amplifier 412_2*b*, to control the switch 414*c* to provide signal content from any of the bands B1, B65, B41 to the third secondary stage low noise amplifier 412_2*c*, and to control the switch 414*d* to provide signal content from any of the bands B25, B3, B30 to the fourth secondary stage low noise amplifier 412_2*d*.

The secondary stage low noise amplifiers 412_2*a-d* can be relatively broadband amplifiers. For example, the secondary stage low noise amplifiers 412_2*a-d* can be configured to support signal frequencies across a wider range than some or all of the initial stage low noise amplifiers 412_1*a*-1 to which they are connected via the respective switches 414*a*-414*d*. In the illustrated embodiment, for example, in order to support any of connectable bands B7, B10, or B38, the first secondary stage low noise amplifiers 412_2*a* is configured to support at least signal frequencies from 2110 MHz (lower end of B10 DL ranges) to 2690 MHz (upper end of B7 DL range). In order to support any of connectable bands B2, B40, or B9, the second secondary stage low noise amplifier 412_2*b* is configured to support at least signal frequencies from 1844.9 MHz (lower end of B9) to 2400 MHz (upper end of B40). In order to support any of connectable bands B1, B65, or B41, the third secondary stage low noise amplifier **412_2*c* is configured to support at least signal frequencies from 2110 MHz (lower ends of B1 and B65) to 2690 MHz (upper end of B41). In order to support any of connectable bands B25, B3, or B30, the fourth secondary stage low noise amplifier 412_2*d*** is configured to support at least signal frequencies from 1805 MHz (lower end of B3) to 2360 MHz (upper end of B30).

In various implementations, one or more of the secondary stage low noise amplifiers **412_2*a-d* can be configured to support signal frequencies spanning a range of at least at least 300, 400, 500, 600, 700, 800, 900, or 1000 MHz, or signal frequencies spanning a range that is at least two, three, four, five, six, seven, eight, nine, or ten times as wide as the range supported by some or all of the initial stage low noise amplifiers 412_1*a*-1 connectable to the respective secondary stage low noise amplifier 412_2*a-d***.

The attenuators **504*a-d* and/or tunable matching circuits 506*a-d* can be dynamically tuned to improve operation of the diversity path 440. For instance, the attenuators 504*a-d* and/or the tunable matching circuits 506*a-d* can be dynamically tuned based on the currently active band. For instance, the first attenuator 504*a* and/or the first tunable matching circuit 506*a* can be dynamically adjusted depending on which connectable band B7, B10, B38 is active on the first diversity output path 508*a* at a given time, and the attenuators 504*b-d* and tunable matching circuits 506*b-d* of the remaining output bands 508*b-d*** are likewise dynamically tunable based on the actively switched in band.

In some embodiments, the tunable matching circuits **506*a-d* can include one or more inductors and capacitors arranged in a network. In the illustrated embodiment, the output filters include a dynamically tunable capacitor, where the controller of the mobile device 400 can adjust the capacitance to dynamically tune the tunable matching circuits 506*a-d***.

The MIMO path 442 is connected to a MIMO antenna **404*b* and in the illustrated embodiment is generally similar to the MIMO path 442 of FIG. 5A, including a switching module 502*b*, filters 413*m*-413*p*, initial stage low noise amplifiers 512_1*m*-512_1*p*, switches 414*e-f*, secondary stage low noise amplifiers 412_2*e-f*, attenuators 504*e-f*, tunable matching circuits 506*e-f*, and output paths 508*e-f***.

The diversity path 440 and some of the MIMO path 442 of FIG. 5C reside on the same packaged module, while some of the componentry of the MIMO path 442 resides elsewhere, such as on a phone board of the mobile device 400, or a different packaged module. Specifically, as represented by the dashed lines in the lower right portion of FIG. 5C, the switch module **502*b* and filters 413*m-p* of the MIMO path 442 reside on the phone board or are otherwise separate from the packaged module, while the diversity path 440 and the remaining componentry of the MIMO path 442 resides on the same packaged module, as delineated by the solid line. In some other embodiments, the entire MIMO path 442 resides on the same packaged module as the diversity path 440**.

Figure 5D:
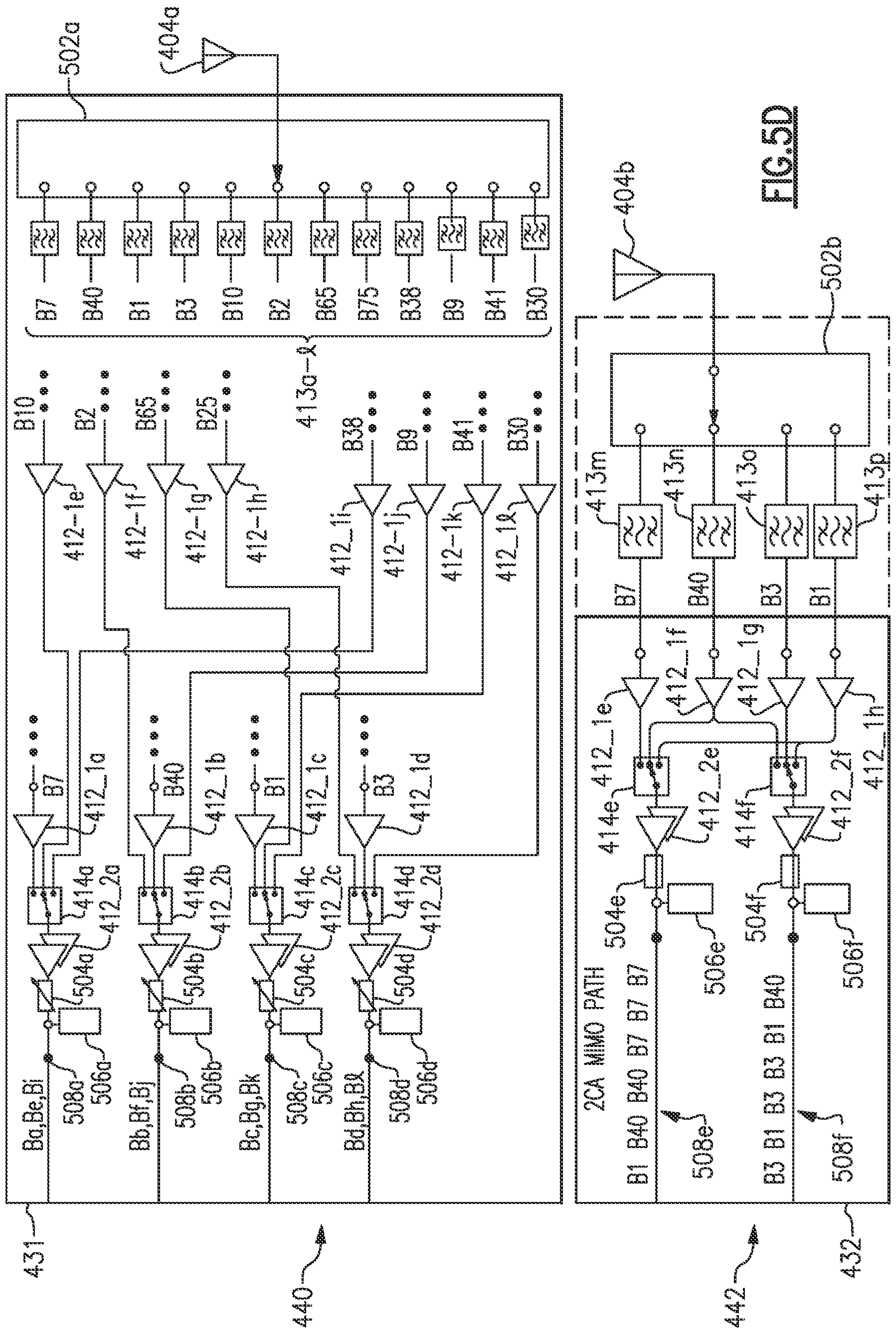

FIG. 5D shows an embodiment where the front end system 403 includes a diversity receive module 431 comprising the diversity path 440 similar to that of FIG. 5C, and further includes a separate MIMO module 432 including the MIMO path 442. As illustrated by the dashed lines, a portion of the MIMO path 442 may reside on the phone board rather than on the MIMO module 432 with the rest of the MIMO path 442. In other embodiments, the entire MIMO path 442 resides on the same module.

Mobile Device with Diversity Receive Front-End Module

Figure 6A:
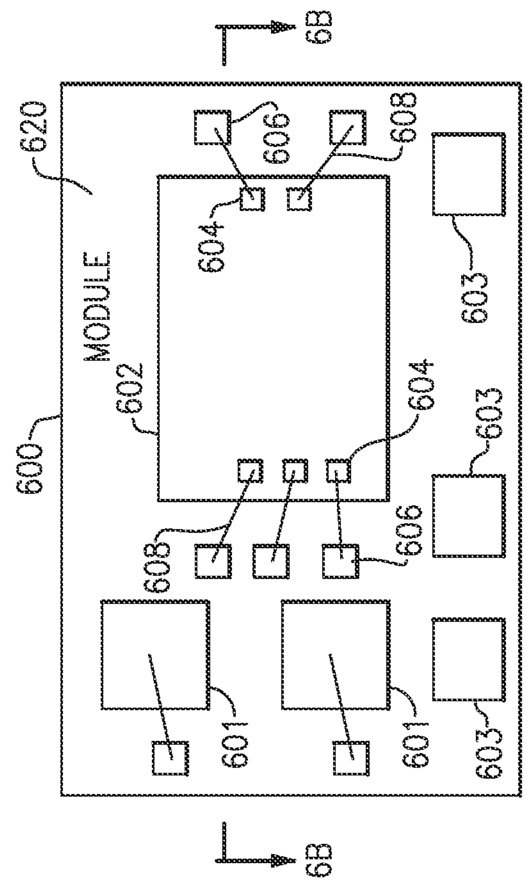
FIG. 6A is a schematic diagram of one embodiment of a packaged module.
Figure 6B:
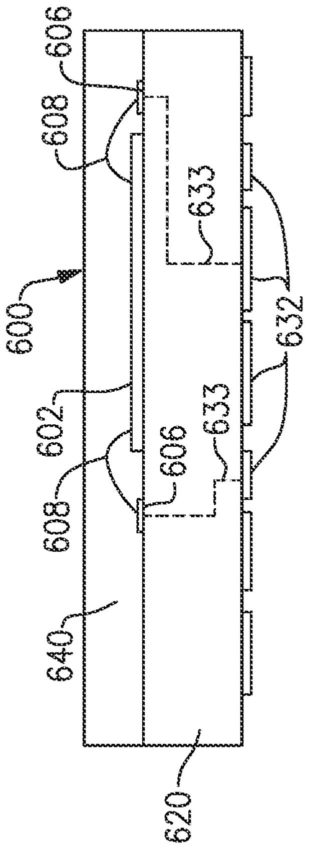
FIG. 6B is a schematic diagram of a cross-section of the packaged module of FIG. 6A taken along the lines 6B-6B.

FIG. 6A is a schematic diagram of one embodiment of a packaged module 600. FIG. 6B is a schematic diagram of a cross-section of the packaged module 600 of FIG. 6A taken along the lines 6B-6B. For example, the packaged module 600 can be any of the primary path modules 430, diversity receive modules 431, or MIMO modules 432 shown and described here, e.g., with respect to FIGS. 4A-4C and 5A-5D.

The packaged module 600 includes radio frequency components 601, a semiconductor die 602, surface mount devices 603, wirebonds 608, a package substrate 620, and an encapsulation structure 640. The package substrate 620 includes pads 606 formed from conductors disposed therein. Additionally, the semiconductor die 602 includes pins or pads 604, and the wirebonds 608 have been used to connect the pads 604 of the die 602 to the pads 606 of the package substrate 620.

The semiconductor die 602 can include amplifiers including one or more power amplifiers and/or low noise amplifiers, depending on the functionality of the module 600, in addition to other appropriate componentry.

The packaging substrate 620 can be configured to receive a plurality of components such as radio frequency components 601, the semiconductor die 602 and the surface mount devices 603, which can include, for example, surface mount capacitors and/or inductors. In one implementation, the radio frequency components 601 include integrated passive devices (IPDs).

As shown in FIG. 6B, the packaged module 600 is shown to include a plurality of contact pads 632 disposed on the side of the packaged module 600 opposite the side used to mount the semiconductor die 602. Configuring the packaged module 600 in this manner can aid in connecting the packaged module 600 to a circuit board, such as a phone board of a mobile device. The example contact pads 632 can be configured to provide radio frequency signals, bias signals, and/or power (for example, a power supply voltage and ground) to the semiconductor die 602 and/or other components. As shown in FIG. 6B, the electrical connections between the contact pads 632 and the semiconductor die 602 can be facilitated by connections 633 through the package substrate 620. The connections 633 can represent electrical paths formed through the package substrate 620, such as connections associated with vias and conductors of a multilayer laminated package substrate.

In some embodiments, the packaged module 600 can also include one or more packaging structures to, for example, provide protection and/or facilitate handling. Such a packaging structure can include overmold or encapsulation structure 640 formed over the packaging substrate 620 and the components and die(s) disposed thereon.

It will be understood that although the packaged module 600 is described in the context of electrical connections based on wirebonds, one or more features of the present disclosure can also be implemented in other packaging configurations, including, for example, flip-chip configurations.

CONCLUSION

For the purpose of description, it will be understood that a module can be a physical module and/or a functional block configured to provide a desired modular functionality with one or more devices and/or circuits. For example, a physical module can be a packaged module implemented on a packaging substrate, a packaged die configured to be mounted on a circuit board, or any other physical device configured to provide RF functionality. It will also be understood that a module can include one or more physical devices, including a plurality of physical devices with each sometimes being referred to as a module itself.

Also for the purpose of description, it will be understood that a component can be physical device and/or an assembly of one or more devices and/or circuits configured to provide a functionality. In some situations, a component can also be referred to as a module, and vice versa.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed:

1. A radio frequency front end module comprising:

a plurality of initial amplification stages each configured to amplify a corresponding radio frequency receive signal;

a first secondary amplification stage and a first switch, the first switch configured to receive intermediate amplified outputs from at least two first stages of the initial amplification stages and to selectively output one of the intermediate amplified outputs to an input of the first secondary amplification stage;

a second secondary amplification stage and a second switch, the second switch configured to receive intermediate amplified outputs from at least two second stages of the initial amplification stages and to selectively output one of the intermediate amplified outputs to an input of the second secondary amplification stage, one or more of the intermediate amplified outputs received by the first switch also received by the second switch, the first secondary amplification stage having a first operational frequency range wider than any operational frequency range of the at least two first stages, the second secondary amplification stage having a second operational frequency range wider than any operational frequency range of the at least two second stages; and a plurality of filters each connected to a corresponding initial amplification stage of the initial amplification stages and having a different passband.

2. The radio frequency front end module of claim 1 wherein the first switch is configured to receive intermediate amplified outputs from at least three of the initial amplification stages and to selectively output one of the intermediate amplified outputs to the input of the first secondary amplification stage, and the second switch is configured to receive intermediate amplified outputs from at least three of the initial amplification stages and to selectively output one of the intermediate amplified outputs to the input of the second secondary amplification stage.

3. The radio frequency front end module of claim 2 wherein two or more of the intermediate amplified outputs received by the first switch are also received by the second switch.

4. The radio frequency front end module of claim 1 further comprising a first tunable matching circuit connected to an output of the first secondary amplification stage and dynamically tunable based on which of the intermediate amplified outputs are selectively output by the first switch, and a second tunable matching circuit connected to an output of the second secondary amplification stage and dynamically tunable based on which of the intermediate amplified outputs are selectively output by the second switch.

5. The radio frequency front end module of claim 1 wherein the first secondary amplification stage has a first operational frequency range that encompasses the passbands of each of the filters connected to the at least two first stages, and the second secondary amplification stage has a second operational frequency range that encompasses the passbands of each of the filters connected to the at least two second stages.

6. A radio frequency front end system comprising:

first and second antennas; and first and second radio frequency sub-systems connected to the first and second antennas respectively, each of the first and second radio frequency sub-systems including a plurality of initial amplification stages, first and second secondary amplification stages, and first and second switches, the first switch configured to receive intermediate amplified outputs from at least two first stages of the initial amplification stages and to selectively output one of the intermediate amplified outputs to an input of the first secondary amplification stage, the second switch configured to receive intermediate amplified outputs from at least two second stages of the initial amplification stages and to selectively output one of the intermediate amplified outputs to an input of the second secondary amplification stage, one or more of the intermediate amplified outputs received by the first switch also received by the second switch, the first radio frequency sub-system implementing a diversity path and configured to aggregate at least two component carriers for downlink, and the second radio frequency sub-system implementing a multi-input multi-output path and configured to aggregate the at least two component carriers for downlink; and a third radio frequency sub-system that implements a primary path configured to aggregate the at least two component carriers for downlink and that implements uplink functionality.

7. The radio frequency front end system of claim 6 wherein the first switch is configured to receive intermediate amplified outputs from at least three of the initial amplification stages and to selectively output one of the intermediate amplified outputs to the input of the first secondary amplification stage, and the second switch is configured to receive intermediate amplified outputs from at least three of the initial amplification stages and to selectively output one of the intermediate amplified outputs to the input of the second secondary amplification stage.

8. The radio frequency front end system of claim 7 wherein two or more of the intermediate amplified outputs received by the first switch are also received by the second switch.

9. The radio frequency front end system of claim 6 further comprising a first tunable matching circuit connected to an output of the first secondary amplification stage and dynamically tunable based on which of the intermediate amplified outputs are selectively output by the first switch, and a second tunable matching circuit connected to an output of the second secondary amplification stage and dynamically tunable based on which of the intermediate amplified outputs are selectively output by the second switch.

10. The radio frequency front end system of claim 6 further comprising a plurality of filters, each of the plurality of filters connected to a corresponding initial amplification stage of the plurality of amplification stages, each of the plurality of filters having a different passband.

11. The radio frequency front end system of claim 10 wherein the first secondary amplification stage has a first operational frequency range that encompasses the passbands of each of the filters connected to the at least two first stages, and the second secondary amplification stage has a second operational frequency range that encompasses the passbands of each of the filters connected to the at least two second stages.

12. The radio frequency front end system of claim 10 wherein the first secondary amplification stage has a first operational frequency range that is wider than any of the operational frequency ranges of the at least two first stages, and the second secondary amplification stage has a second operational frequency range that is wider than any of the operational frequency ranges of the at least two second stages.

13. The radio frequency front end system of claim 6 wherein the primary path aggregates at least four component carriers, the diversity path also aggregates the at least four component carriers, and the multi-input multi-output path aggregates at least a subset of the at least four component carriers.

14. A mobile device comprising:

first, second, and third antennas;

a primary path radio frequency sub-system connected to the first antenna and configured to support uplink and downlink for at least two radio frequency bands, and to aggregate at least two component carriers for carrier aggregation for at least the downlink; and a diversity path radio frequency sub-system and a multi-input multi-output path radio frequency subsystem connected to the second and third antennas respectively and each configured to aggregate least two component carriers for downlink carrier aggregation, the diversity path radio frequency sub-system including a plurality of initial amplification stages, first and second secondary amplification stages, and first and second switches, the first switch configured to receive intermediate amplified outputs from at least two of the initial amplification stages and to selectively output one of the intermediate amplified outputs to an input of the first secondary amplification stage, the second switch configured to receive intermediate amplified outputs from at least two of the initial amplification stages and to selectively output one of the intermediate amplified outputs to an input of the second secondary amplification stage, one or more of the intermediate amplified outputs received by the first switch also received by the second switch.

15. The mobile device of claim 14 wherein the first switch is configured to receive intermediate amplified outputs from at least three of the initial amplification stages and to selectively output one of the intermediate amplified outputs to the input of the first secondary amplification stage, the second switch is configured to receive intermediate amplified outputs from at least three of the initial amplification stages and to selectively output one of the intermediate amplified outputs to the input of the second secondary amplification stage.

16. A radio frequency front end system comprising:

first and second antennas;

first and second radio frequency sub-systems connected to the first and second antennas respectively, each of the first and second radio frequency sub-systems including a plurality of initial amplification stages, first and second secondary amplification stages, and first and second switches, the first switch configured to receive intermediate amplified outputs from at least two first stages of the initial amplification stages and to selectively output one of the intermediate amplified outputs to an input of the first secondary amplification stage, the second switch configured to receive intermediate amplified outputs from at least two second stages of the initial amplification stages and to selectively output one of the intermediate amplified outputs to an input of the second secondary amplification stage, one or more of the intermediate amplified outputs received by the first switch also received by the second switch, the first secondary amplification stage having a first operational frequency range wider than any operational frequency range of the at least two first stages, the second secondary amplification stage having a second operational frequency range wider than any operational frequency range of the at least two second stages; and a plurality of filters, each of the plurality of filters connected to a corresponding initial amplification stage of the plurality of amplification stages, each of the plurality of filters having a different passband.

17. The radio frequency front end system of claim 16 wherein the first radio frequency sub-system is configured to aggregate at least two component carriers for downlink, and the second radio frequency sub-system is also configured to aggregate the at least two component carriers for downlink.

18. The radio frequency front end system of claim 17 wherein the first radio frequency sub-system implements a diversity path and the second radio frequency sub-system implements a multi-input multi-output path.

19. The radio frequency front end system of claim 18 further comprising a third radio frequency sub-system that implements a primary path configured to aggregate the at least two component carriers for downlink and that also implements uplink functionality.

20. The radio frequency front end system of claim 19 wherein the primary path aggregates at least four component carriers, the diversity path also aggregates the at least four component carriers, and the multi-input multi-output path aggregates at least a subset of the at least four component carriers.

* * * * *